United States Patent
Dong et al.

(10) Patent No.: US 9,224,442 B2
(45) Date of Patent: Dec. 29, 2015

(54) SYSTEM AND METHOD TO DYNAMICALLY DETERMINE A TIMING PARAMETER OF A MEMORY DEVICE

(71) Applicant: QUALCOMM Incorporated, San Diego, CA (US)

(72) Inventors: Xiangyu Dong, La Jolla, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 425 days.

(21) Appl. No.: 13/842,410

(22) Filed: Mar. 15, 2013

(65) Prior Publication Data

US 2014/0281327 A1 Sep. 18, 2014

(51) Int. Cl.
*G06F 12/00* (2006.01)
*G11C 7/22* (2006.01)
*G06F 3/06* (2006.01)
*G11C 11/4076* (2006.01)
*G06F 17/50* (2006.01)
*G11C 29/02* (2006.01)
*G11C 29/50* (2006.01)
*G11C 29/04* (2006.01)

(52) U.S. Cl.
CPC *G11C 7/22* (2013.01); *G06F 3/061* (2013.01); *G06F 3/0611* (2013.01); *G06F 3/0629* (2013.01); *G06F 12/00* (2013.01); *G06F 17/5031* (2013.01); *G11C 11/4076* (2013.01); *G11C 29/023* (2013.01); *G11C 29/50012* (2013.01); *G11C 2029/0409* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 6,262,938 B1 | 7/2001 | Lee et al. | |
| 6,483,769 B2 | 11/2002 | La | |
| 8,195,907 B2 | 6/2012 | Ware et al. | |
| 2004/0103258 A1 | 5/2004 | Blackmon et al. | |
| 2006/0112250 A1 | 5/2006 | Walker et al. | |
| 2010/0077140 A1 | 3/2010 | Abraham et al. | |
| 2010/0195421 A1 | 8/2010 | Jeddeloh | |
| 2010/0237463 A1 | 9/2010 | Kang et al. | |
| 2012/0284576 A1 | 11/2012 | Housty et al. | |
| 2013/0039135 A1 | 2/2013 | Kang et al. | |
| 2013/0058178 A1 | 3/2013 | Lai et al. | |

OTHER PUBLICATIONS

International Search Report and Written Opinion for International Application No. PCT/US2014/024311, ISA/EPO, Date of Mailing Oct. 10, 2014, 14 pages.
Partial International Search Report for International Application No. PCT/US2014/024311, ISA/EPO, Date of Mailing Jul. 14, 2014, 5 pages.

*Primary Examiner* — Midys Rojas
(74) *Attorney, Agent, or Firm* — Toler Law Group

(57) ABSTRACT

A particular method includes receiving, from a processor, a first memory access request at a memory device. The method also includes processing the first memory access request based on a timing parameter of the memory device. The method further includes receiving, from the processor, a second memory access request at the memory device. The method also includes modifying a timing parameter of the memory device based on addresses identified by the first memory access request and the second memory access request to produce a modified timing parameter. The method further includes processing the second memory access request based on the modified timing parameter.

51 Claims, 12 Drawing Sheets

SYSTEM AND METHOD TO DYNAMICALLY DETERMINE A TIMING PARAMETER OF A MEMORY DEVICE

I. FIELD

The present disclosure is generally related to determining a timing parameter of a memory device.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, may communicate voice and data packets over wireless networks. Further, many such wireless telephones include other types of devices that are incorporated therein. For example, a wireless telephone may also include a digital still camera, a digital video camera, a digital recorder, and an audio file player. Also, such wireless telephones may process executable instructions, including software applications, such as a web browser application, that may be used to access the Internet. As such, these wireless telephones may include significant computing capabilities.

A computing device may include a memory device (e.g., dynamic random access memory (DRAM)). The memory device may include a plurality of storage elements arranged into a plurality of rows and a plurality of columns. The memory device may process memory access requests received from a processor based on timing parameters (e.g., a read-to-data latency (RL)). The RL timing parameter corresponds to a number of timing cycles between receiving a READ command and providing data associated with the READ command to a data bus. The timing parameters of the memory device may have fixed values (e.g., set by a manufacturer of the memory device). For example, a fixed RL timing parameter may include a row access latency (e.g., a row access strobe (RAS) latency) and a column access latency (e.g., a column access strobe (CAS) latency). Using the fixed RL timing parameter for certain memory access operations may result in an idle data bus for a number of timing cycles, i.e., a data bus that is idle after servicing a prior memory access.

III. SUMMARY

Systems and methods to dynamically determine a timing parameter of a memory device are disclosed. Advantageously, the dynamically determined timing parameter may increase throughput of a data bus. For example, multiple memory access requests may be received by a memory device. A particular memory access request may request data from a same row of memory as a prior memory access request. A fixed timing parameter is defined based on a row access latency and a column access latency that occur when different rows and columns are accessed successively. However, when the row is not changed (i.e., when data from the same row is accessed again) the row access latency is zero. Thus, use of the fixed latency timing parameter leads to data bus idle time associated with row access latency for sequential data requests in the same row.

In accordance with the described techniques, a dynamic timing parameter may be determined based on the column access latency. The dynamic timing parameter may be used to determine when to begin providing data associated with sequential data requests in the same row and may reduce a duration during which the data bus is idle. Data bus throughput is thereby increased for sequential data requests to the same row.

In a particular embodiment, a method includes receiving, from a processor, a first memory access request at a memory device. The method also includes processing the first memory access request based on a timing parameter of the memory device. The method further includes receiving, from the processor, a second memory access request at the memory device. The method includes modifying a timing parameter of the memory device based on addresses identified by the first memory access request and the second memory access request to produce a modified timing parameter. The method further includes processing the second memory access request based on the modified timing parameter.

In another particular embodiment, a memory device includes a plurality of storage elements and memory control logic. The memory control logic is coupled to the plurality of storage elements and to a processor. The memory control logic is configured to dynamically determine a value of a timing parameter at least partially based on memory addresses identified by a plurality of memory access requests received from the processor. The timing parameter corresponds to a number of timing cycles before data associated with at least one of the plurality of memory access requests is provided to a data bus.

In another particular embodiment, an apparatus includes a processor and a memory controller. The memory controller is coupled to the processor and to a memory device. The memory controller is configured to dynamically determine a value of a timing parameter at least partially based on memory addresses identified by a plurality of memory access requests to the memory device. The timing parameter corresponds to a number of timing cycles before data associated with at least one of the plurality of memory access requests is provided to a data bus.

In another particular embodiment, a method includes transmitting a first memory access request from a memory controller to a memory device. The method also includes predicting a first time of a first data transmission from the memory device to the memory controller based on a first value of a timing parameter. The data transmission is associated with the first memory access request. The method further includes transmitting a second memory access request to the memory device. The method also includes determining a second value of the timing parameter based on the first memory access request and the second memory access request. The method further includes predicting a second time of a second data transmission from the memory device to the memory controller based on the second value. The second data transmission is associated with the second memory access request.

In another particular embodiment, a computer-readable storage device stores instructions that, when executed by a processor, cause the processor to receive a first memory access request and process the first memory access request based on a first value of a timing parameter. The instructions, when executed by the processor, also cause the processor to receive a second memory access request. The instructions, when executed by the processor, further cause the processor to modify the timing parameter based at least in part on addresses identified by the first memory access request and the second memory access request to produce a modified timing parameter. The modified timing parameter has a second value. The instructions, when executed by the processor, also cause the processor to process the second memory access request based on the second value.

In another particular embodiment, a method includes a first step for receiving a first memory access request at a memory device from a processor. The method also includes a second step for processing the first memory access request based on a first value of a timing parameter of the memory device. The method further includes a third step for receiving a second memory access request at the memory device from the processor. The method also includes a fourth step for modifying the timing parameter of the memory device based on addresses identified by the first memory access request and the second memory access request to produce a modified timing parameter. The method further includes a fifth step for processing the second memory access request based on the modified timing parameter.

One particular advantage provided by at least one of the disclosed embodiments is that by dynamically updating timing parameters, a data bus of the memory device may be used more efficiently. For example, in certain situations a dynamic RL timing parameter may be lower than a fixed RL timing parameter. The dynamic RL timing parameter may take advantage of an absence of RAS delay for a memory access when the memory access is directed to a same row of memory as a prior memory access. Using the dynamic RL timing parameter may result in the data bus of the memory being idle for a shorter duration.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
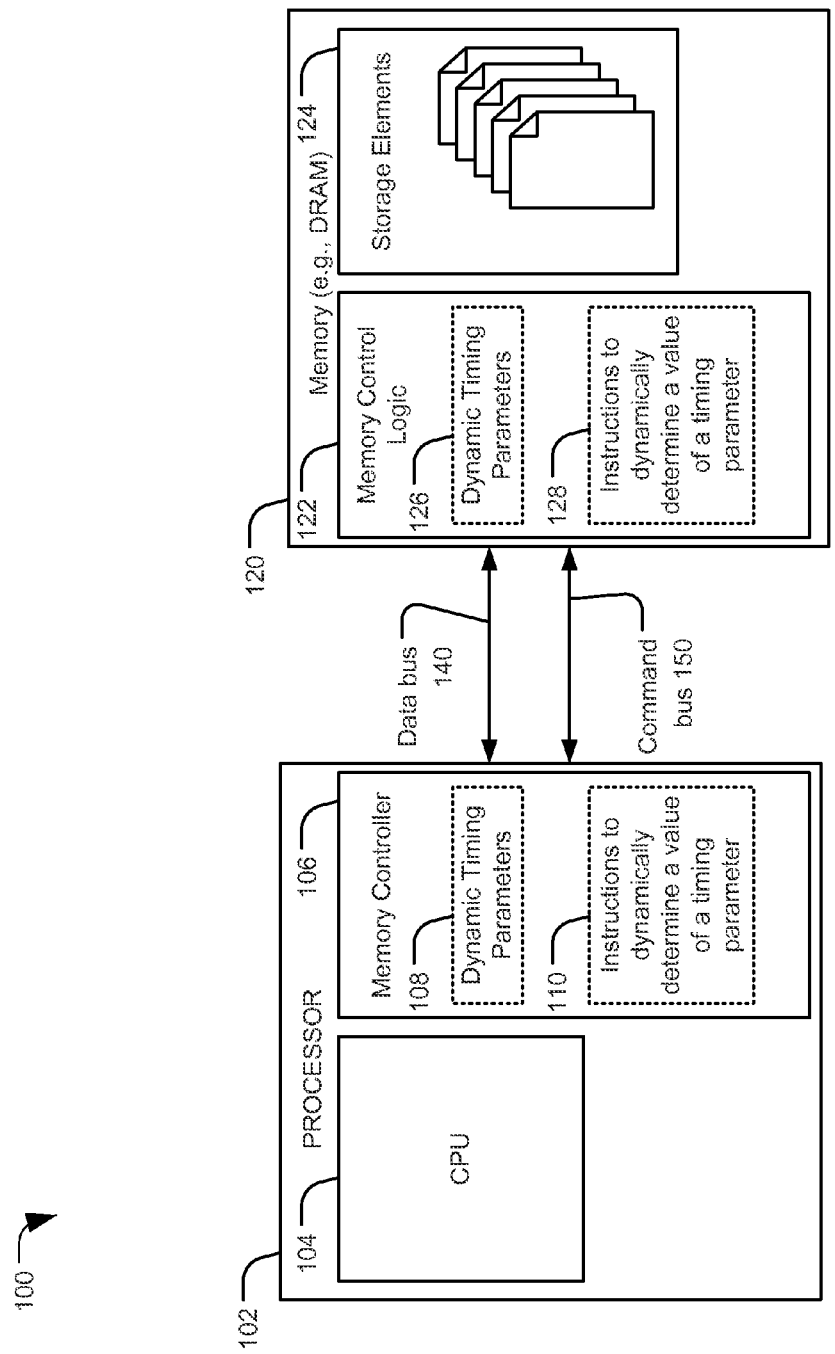
FIG. 1 is a block diagram of a particular illustrative embodiment of a system operable to dynamically determine a timing parameter of a memory device.

Referring to FIG. 1, a particular illustrative embodiment of a system operable to dynamically determine a timing parameter of a memory device is disclosed and generally designated 100. The system 100 includes a processor 102 coupled to a memory 120 via a data bus 140 and via a command bus 150. Examples of the memory 120 include, but are not limited to, a double data rate (DDR) synchronous dynamic random access memory (SDRAM), a non-volatile random access memory (NVRAM), and a dynamic random access memory (DRAM).

The processor 102 includes a central processing unit (CPU) 104 coupled to a memory controller 106. The memory controller 106 may include dynamic timing parameters 108 and may include instructions 110 to dynamically determine a value of a timing parameter. The memory 120 includes memory control logic 122 coupled to a plurality of storage elements 124. The memory control logic 122 may include dynamic timing parameters 126 and may include instructions 128 to dynamically determine a value of a timing parameter. For example, the instructions 128, when executed by the memory control logic 122, may cause the memory control logic 122 to receive a first memory access request from the processor 102. To illustrate, the plurality of storage elements 124 may be arranged into a plurality of rows and a plurality of columns. The number of rows may be different from the number of columns. For example, the number of rows may be higher than the number of columns. The storage elements 124 may include a first storage element and a second storage element in a first row of the plurality of rows. The first storage element is included in a first column of the plurality of columns, and the second storage element is included in a second column of the plurality of columns. The processor 102 may issue the first memory access request via the command bus 150 to access the first storage element. The first memory access request may correspond to a first READ command or a first WRITE command.

The first memory access request may include a row activation command (e.g., an ACT command) and a column activation command (e.g., a first READ command). The ACT command may include a first portion of a row address of the first row, and the first READ command may include a second portion of the row address of the first row and a complete column address of the first column. Because the ACT command includes only the first portion of the row address, the first row may not be activated until the first READ command that includes the second portion of the row address, is received, introducing a processing delay at the memory 120. To reduce the processing delay, the processor 102 may transmit the first READ command based on a value (e.g., one (1) timing cycle) of a row access strobe (RAS)-to-column access strobe (CAS) delay (tRCD). The tRCD timing parameter corresponds to a delay between receiving a row activation command (e.g., an ACT command) and activating the row associated with the row activation command.

When the memory 120 receives both the ACT command and the first READ command, the memory 120 may activate the first row using the first portion of the row address and the second portion of the row address. Once the memory 120 initiates activation of the first row, several timing cycles may elapse before the row activation is complete. The number of timing cycles to complete activation of the first row may correspond to the RAS latency (e.g., five (5) timing cycles).

After the first row has been activated, the memory 120 may activate the first column based on the complete column address included in the first READ command. As with the activation of the first row, several timing cycles may elapse before the column activation is complete. The number of timing cycles to complete activation of the first column may correspond to the CAS latency (e.g., five (5) timing cycles).

The memory 120 may provide first data (e.g., data corresponding to the value stored in the first storage element associated with the first READ command) based on a value of a RL (read-to-data latency) timing parameter. The value of the RL timing parameter may correspond to a sum of the RAS latency and the CAS latency, e.g., indicating that the first data will be provided to the data bus 140 after ten (10) timing cycles have elapsed following receipt of the first READ command.

The memory control logic 122 may process the first memory access request based on the RL timing parameter. For example, when the ACT command is received at the memory 120 during a timing cycle tCK1 (e.g., timing cycle 1) and when the value of the tRCD timing parameter is one (1) timing cycle, the memory 120 may receive the first READ command during a timing cycle tCK2 (e.g., timing cycle 2). When the first READ command is received at the memory 120 during the timing cycle tCK2 and when the value of the RL timing parameter is ten (10) timing cycles, the first data may begin being provided to the data bus 140 during the timing cycle tCK12 (e.g., timing cycle 12). The first data 112 may continue to be provided from the memory 120 to the data bus 140 until a timing cycle tCK15 (e.g., timing cycle 15). After the timing cycle tCK15 (i.e., during and after tCK16), the data bus 140 is not busy and may be used by the memory 120 to receive additional data from or to provide additional data to the processor 102.

The memory control logic 122 may receive a second memory access request from the processor 102. The processor 102 may issue the second memory access request to access the second storage element. The second memory access request may correspond to a second READ command, a second WRITE command, or a precharge command. The second memory access request may include a second column activation command (e.g., a second READ command). The second READ command may include the second portion of the row address of the first row and a complete column address of the second column. For example, the memory 120 may receive the second memory access request after at least a threshold number of timing cycles have elapsed since receiving the first memory access request. The threshold number of timing cycles corresponds to a value of a column-to-column delay (tCCD) timing parameter (e.g., four (4) timing cycles). Assuming row addresses included in subsequent READ commands identify the same row address included in the ACT command and that the subsequent READ commands are received at the memory 120 at intervals of tCCD timing cycles (e.g., every four (4) timing cycles), the memory 120 will be capable of processing each of the memory access requests and providing data to the data bus 140 without any additional delays other than the delay introduced by the timing parameter tRCD when the ACT command was received.

However, when the subsequent READ commands are not received at intervals of tCCD timing cycles (e.g., every four (4) timing cycles), throughput of the data bus 140 may reduced up to fourteen percent (14%) even when the row addresses included in the subsequent READ commands are the same as the row address included in the ACT command with a fixed RL timing parameter (i.e., including the RAS latency and the CAS latency). To illustrate, the second READ command corresponding to the second memory access request may be received during a timing cycle tCK13 (e.g., timing cycle 13). Elapsed timing cycles (i.e., eleven (11) timing cycles) between the first READ command and the second READ command may be higher than the tCCD timing cycles (i.e., four (4) timing cycles). The memory control logic 122 may place the second data on the data bus 140 during a timing cycle tCK23 (e.g., timing cycle 23) based on the RL timing parameter (i.e., ten (10) cycles). The data bus 140 may be idle after servicing the first READ command (i.e., during tCK16) and before placing the second data (i.e., during tCK23) on the data bus 140 (i.e., idle for seven (7) timing cycles). Thus, at timing cycle tCK16, the data bus 140 is ready to receive data from, or provide data to, the processor 102, but the second data is not placed on the data bus 140 until tCK23.

To decrease idle time of the data bus 140, the memory control logic 122 may modify one or more of the dynamic timing parameters 126 based on addresses identified by the first memory access request and the second memory access request. For example, the memory 120 may receive the second memory access request (i.e., the second READ command) from the processor 102 during the timing cycle tCK13. The second READ command may correspond to a request to read the second storage element of the memory 120. The second storage element may be included in a same row (i.e., the first row) as the first storage element associated with the first memory access request (e.g., the ACT command and the first READ command) and may be included in a different column than a column associated with the first READ command. When the second READ command is received, the memory 120 may dynamically determine the value of the RL timing parameter. The dynamically determined value of the RL timing parameter may reduce a number of timing cycles that the data bus 140 is idle.

To illustrate, the second READ command is received during the timing cycle tCK13. To dynamically determine the value of RL, the memory 120 may determine a first difference (x) according to the following equation:

$$x = (tCKR_2) - (tCKR_1) - (tCCD) \qquad \text{(equation 1)}$$

In equation 1, $tCKR_2$ corresponds to the timing cycle when the second READ command is received and $tCKR_1$ corresponds to the timing cycle when the first READ command is received. In the described example, the second READ command is received during the timing cycle tCK13 (e.g., $tCKR_2=13$), the first READ command is received during the timing cycle tCK2 (e.g., $tCKR_1=2$), and the tCCD timing parameter is fixed (i.e., four (4) timing cycles). Therefore, x=seven (7) (e.g., x=13−2−4). After determining the first difference, the memory 120 may determine a second difference between the value of RL timing parameter used for the previous read (e.g., the first READ command) and x according to the following equation:

$$\text{potential\_RL\_value} = RL(\text{previous\_read}) - x \qquad \text{(equation 2)}$$

In equation 2, the potential_RL_value represents a potential new value of the RL timing parameter, RL(previous_read) corresponds to the value of RL used for the previous READ (e.g., the RL timing parameter when the memory 120 processed the first READ command), and x corresponds to a result of equation 1 (e.g., the first difference). To illustrate, the RL(previous_read) corresponds to the sum of the RAS delay and the CAS delay and has a value of ten (10). As explained above, x has a value of seven (7). Thus, the potential_RL_value=three (3) (e.g., potential_RL_ value=10−7). The memory 120 may be configured to constrain the potential_RL_value based on the value of the timing parameter tCCD (e.g., the threshold number of timing cycles between successive READ operations). Accordingly, the memory device may constrain the outcome of equation 2 to the CAS delay (e.g., five (5) timing cycles) when the potential_RL_value is less than the CAS delay. The memory device may then dynamically determine the value of a RL' timing parameter according to the following equation:

$$RL'=\max(\text{potential\_RL\_value}, RL0) \quad \text{(equation 3)}$$

In equation 3, RL' corresponds to the value of the RL timing parameter that is to be used by the memory 120 to process the second READ command (e.g., a number of timing cycles between receiving the second READ command and providing the second data associated with the second READ command to the data bus 140). In equation 3, RL0 corresponds to the CAS latency (e.g., five (5) timing cycles). The memory device may dynamically determine the RL' value of the RL timing parameter by comparing the potential_RL_ value and the value of RL0 (e.g., a five (5) timing cycle delay). When the value of RL0 is greater than the potential_RL_ value, RL' is set to the value of RL0. When the value of RL0 is less than the potential_RL_value, RL' is set to the potential_RL_value. As explained above, the potential_RL_value is four (4) timing cycles. Thus. RL'=five (5) (e.g., RL'=max (4, 5)). The second data may be provided to the data bus 140 based on the dynamically determined value of the RL timing parameter (i.e., RL'=5). The dynamically determined value of the RL timing parameter corresponds to the value of RL0 (e.g., the CAS latency).

The memory control logic 122 may process the second memory access request based on the modified timing parameter (i.e., the dynamic timing parameters 126). When the timing parameter RL is set to the value of RL', the second data associated with the second READ command may be provided during a timing cycle tCK18 (i.e., five (5) timing cycles after receiving the second READ command). When compared to the fixed RL value, the dynamically determined RL value (e.g., RL') results in a reduced number of timing cycles that the data bus 140 is idle. For example, when using the fixed value of the timing parameter RL (i.e., ten (10) timing cycles), the data bus 140 is idle for seven (7) timing cycles. When using the dynamically determined value of RL (i.e., five (5) timing cycles), the data bus 140 is idle for two (2) timing cycles. Accordingly, the memory 120 is capable of providing the second data to the data bus 140 five (5) timing cycles sooner when using the dynamically determined value of RL timing parameter.

The processor 102 may use dynamically determined timing parameters (e.g., the dynamic timing parameters 108) to predict a time of receipt of a data transmission from the memory 120. For example, the processor 102 may predict receipt of the first data during the timing cycle tCK12 based on a value of the RL timing parameter (e.g., ten (10) timing cycles) and may predict receipt of the second data from the memory 120 during the timing cycle tCK18 (e.g., timing cycle 18) based on the dynamically determined value of RL (e.g., RL'=five (5) timing cycles).

In a particular embodiment, the instructions 110, when executed by the memory controller 106, may cause the memory controller 106 to dynamically determine a value of the RL (i.e., RL') at least partially based on memory addresses identified by a plurality of memory access requests transmitted to the memory 120. In a particular embodiment, the memory 120 may provide the dynamic timing parameters 126 to the memory controller 106 and the memory controller 106 may update the dynamic timing parameters 108 based on the received dynamic timing parameters 126. For example, the memory 120 may transmit the dynamically determined value of the RL timing parameter (i.e., RL'=5) to the processor 102 and the processor 102 may predict times of receipt of data transmissions from the memory device based on the RL' value received from the memory 120. In a particular embodiment, the memory 120 may provide other values (e.g., the potential_RL_value and the RL0) to the memory controller 106 and the memory controller 106 may determine RL' based on the other values.

It should be noted that the RL timing parameter is used herein as an illustrative example. In a particular embodiment, the RL timing parameter, a write-to-data latency (WL) timing parameter, a read-to-precharge latency (tRTP) timing parameter, a write-to-precharge latency (tWTP) timing parameter, other timing parameters, or a combination thereof, may be determined dynamically by the memory control logic 122, the memory controller 106, or both. The WL timing parameter corresponds to a number of timing cycles between receiving a WRITE command and making the data bus available to receive the data associated with the WRITE command. The tRTP timing parameter corresponds to a number of timing cycles between receiving a READ command and a row precharge command. The tWTP timing parameter corresponds to a number of timing cycles between receiving a WRITE command a row precharge command.

For example, a value of the WL timing parameter may be dynamically determined based on equations 4 and 5.

$$\text{potential\_WL\_value}=WL(\text{previous\_write})-x \quad \text{(equation 4)}$$

The WL (previous_write) may correspond to a value of the WL timing parameter used for a prior WRITE command. In a particular embodiment, the WL (previous_write) may correspond to the RAS delay and the CAS delay.

$$WL'=\max(\text{potential\_WL\_value}, WL0) \quad \text{(equation 5)}$$

The memory control logic 122 may determine a dynamic value of the WL timing parameter (i.e., WL') based on a comparison of the potential_WL_value and WL0. In a particular embodiment, WL0 may correspond to the CAS delay. WL value corresponding to a subsequent write command may be higher of the potential_WL_value and the WL0.

Thus, a value of one or more timing parameters (e.g., a RL timing parameter, a WL timing parameter, etc.) may be determined dynamically and may be used to reduce a number of timing cycles that the data bus 140 is idle between servicing subsequent memory access requests to a same row of the storage elements 124. For example, the memory control logic 122 may, upon receiving a subsequent memory access request after a greater number of elapsed timing cycles than tCCD (e.g., 5 or more), may take advantage of the absence of the RAS delay and place the data corresponding to the subsequent memory access request on the data bus 140 without having to wait for the full RAS delay. For example, the memory control logic 122 may wait for the CAS delay and any timing cycles to empty the data bus 140 of the first data associated with a prior memory access request. The timing cycles to empty the data bus 140 may be less than the RAS delay.

Figure 2:
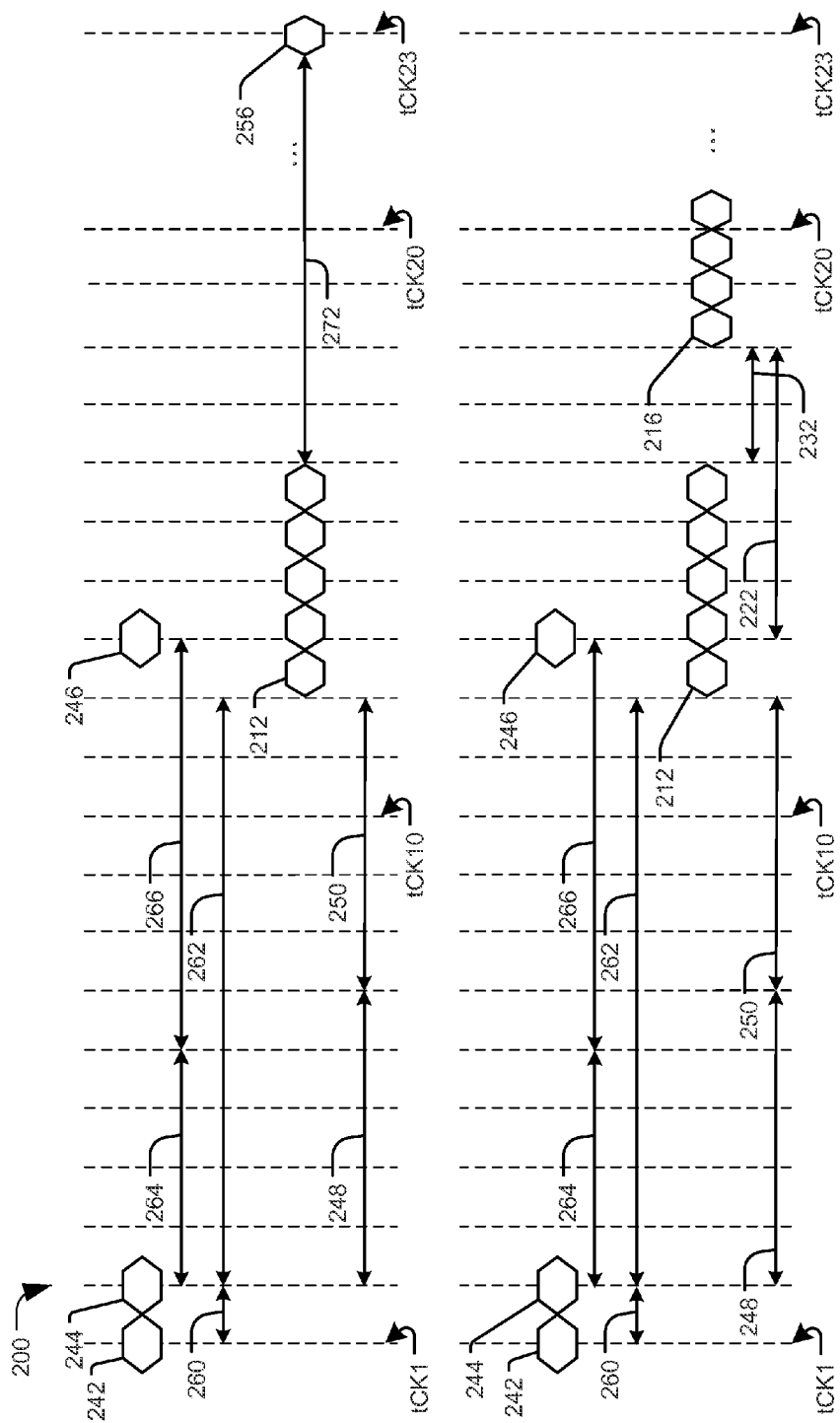
FIG. 2 is a timing diagram associated with determining a dynamic timing parameter of the system of FIG. 1.

Referring to FIG. 2, a timing diagram associated with determining a dynamic timing parameter of the system of FIG. 1 is disclosed and generally designated 200. The timing diagram 200 includes an ACT command 242 (e.g., the ACT command corresponding to the first memory access request) received by the memory control logic 122 during tCK1. The timing diagram 200 includes a first READ command 244 (e.g., the first READ command corresponding to the first memory access request) received by the memory control logic 122 during tCK2. The timing diagram 200 illustrates a delay 260 corresponding to a tRCD timing parameter (e.g., one (1) timing cycle). The timing diagram 200 includes a delay 248 corresponding to a RAS delay (e.g., the RAS delay of five (5) timing cycles) and a delay 250 corresponding to a CAS delay (e.g., the CAS delay of five (5) timing cycles). A delay 262 corresponds to a value of the RL timing parameter (e.g., ten (10) timing cycles).

The timing diagram 200 illustrates that the memory control logic 122 of FIG. 1 places data 212 (e.g., the first data) corresponding to the first READ command 244 on the data bus 140 at tCK12 using the RL timing parameter, e.g., ten (10) timing cycles after the first READ command 244 is received (i.e., during tCK2). The timing diagram 200 shows that a second READ command 246 (e.g., the second READ command) is received by the memory control logic 122 during tCK13.

Using the fixed RL timing parameter (i.e., ten (10) timing cycles), the memory control logic 122 may place second data 256 corresponding to the second READ command 246 on the data bus 140 of FIG. 1 during tCK23. The data bus 140 may become available during tCK16 and remain idle for seven (7) timing cycles. A delay 272 corresponds to the timing cycles during which the data bus 140 is idle when dynamic timing parameters are not used.

The memory control logic 122 may dynamically determine a value of the RL timing parameter (RL'), as described with reference to FIG. 1. For example, the tCCD timing parameter may correspond to a delay 264 (e.g., four (4) timing cycles) and the first difference (x) may correspond to a delay 266 (e.g., seven (7) timing cycles). The second difference (i.e., the potential_RL_value) may correspond to a difference between the delay 262 and the delay 266 (i.e., RL(previous_read)−x=10−7=3). Since the second difference is lower than the delay 250 (i.e., the CAS delay), RL' corresponds to the CAS delay (i.e., RL'=max (potential_RL_value, RL0)). A delay 222 illustrates the RL timing parameter with a value of RL'.

Using the dynamically determined value of the RL timing parameter (e.g., RL') the memory control logic 122 may place second data 216 on the data bus 140 of FIG. 1 during tCK18. The data bus 140 may remain idle for two (2) timing cycles. A delay 232 corresponds to the timing cycles during which the data bus 140 is idle when using RL'. The delay 232 (i.e., two (2) timing cycles) is shorter than the delay 272 (i.e., seven (7) timing cycles).

Thus, the data bus 140 of FIG. 1 may be idle for a fewer number of timing cycles (i.e., two (2) timing cycles) before the memory control logic 122 of FIG. 1 places the second data 216 on the data bus using the dynamically determined value of the RL timing parameter.

Figure 3:
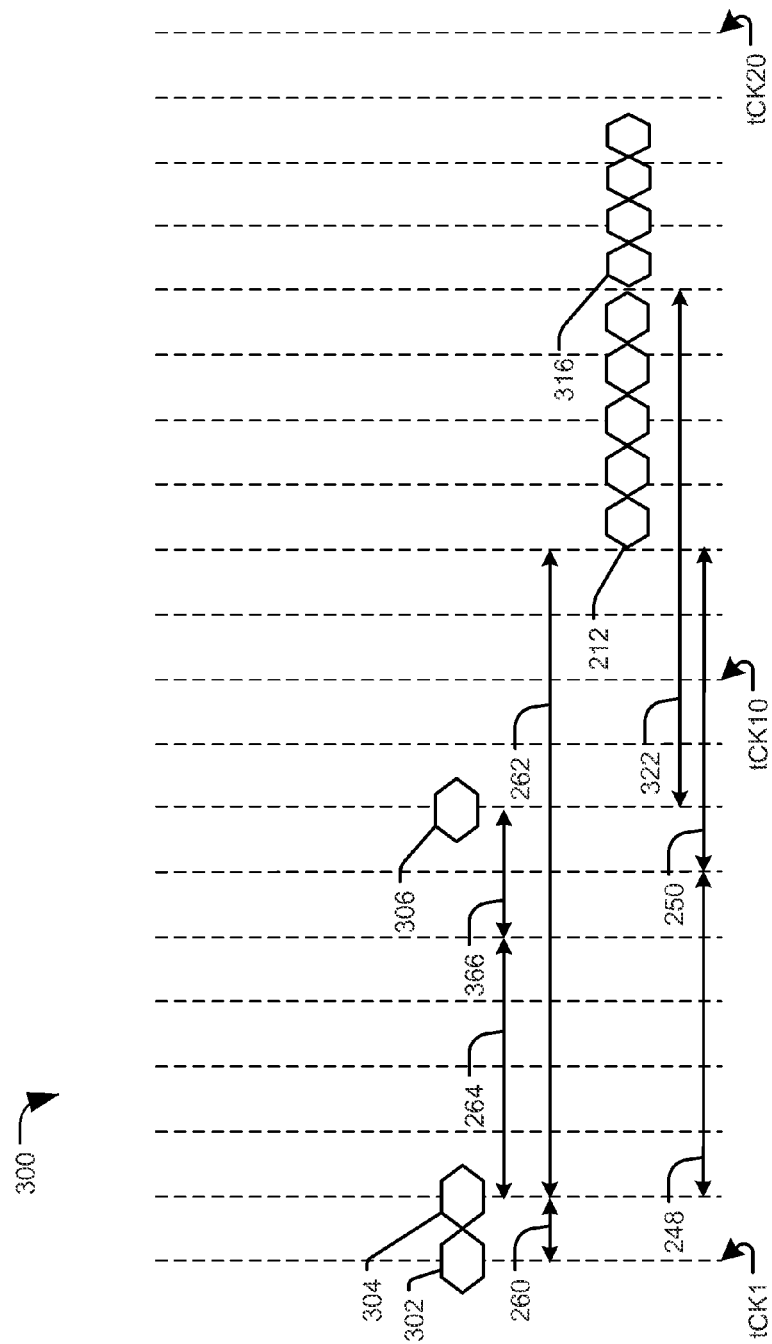
FIG. 3 is another timing diagram associated with determining a dynamic timing parameter of the system of FIG. 1.

Referring to FIG. 3, another timing diagram associated with determining a dynamic timing parameter of the system of FIG. 1 is disclosed and generally designated 300. The timing diagram 300 illustrates an ACT command 302 received by the memory control logic 122 of FIG. 1 during a timing cycle tCK1 and a first READ command 304 received by the memory control logic 122 of FIG. 1 during a timing cycle tCK2. The timing diagram 300 illustrates a second READ command 306 received by the memory control logic 122 of FIG. 1 during a timing cycle tCK8. Using the fixed RL timing parameter, the memory control logic 122 of FIG. 1 would place data corresponding to the second READ command 306 on the data bus 140 of FIG. 1 during tCK18. The data bus 140 may become available during tCK16 and remain idle for two (2) timing cycles.

The memory control logic 122 may dynamically determine a value of the RL timing parameter (RL'), as described with reference to FIG. 1. For example, the tCCD timing parameter may correspond to a delay 264 (e.g., four (4) timing cycles) and the first difference (x) may correspond to a delay 366 (e.g., two (2) timing cycles). The second difference (i.e., the potential_RL_value) may correspond to a difference between the delay 262 and the delay 366 (i.e., RL(previous_read)−x=10−2=8). Since the second difference is higher than the delay 250 (i.e., the CAS delay), RL' corresponds to the potential_RL_value (i.e., RL'=max (potential_RL_value. RL0)=max (8, 5)=8). The RL timing parameter with a value of RL' is illustrated in the timing diagram 300 as a delay 322.

Using the dynamically determined value of the RL timing parameter (e.g., RL') the memory control logic (i.e., the memory control logic 122) may place second data 316 on the data bus (i.e., the data bus 140 of FIG. 1) during tCK16.

Thus, the data bus (i.e., the data bus 140 of FIG. 1) may be idle for a fewer number of timing cycles (i.e., zero (0) timing cycles) before the memory control logic (i.e., the memory control logic 122 of FIG. 1) places the second data 316 on the data bus using the dynamically determined value of the RL timing parameter.

Figure 4:
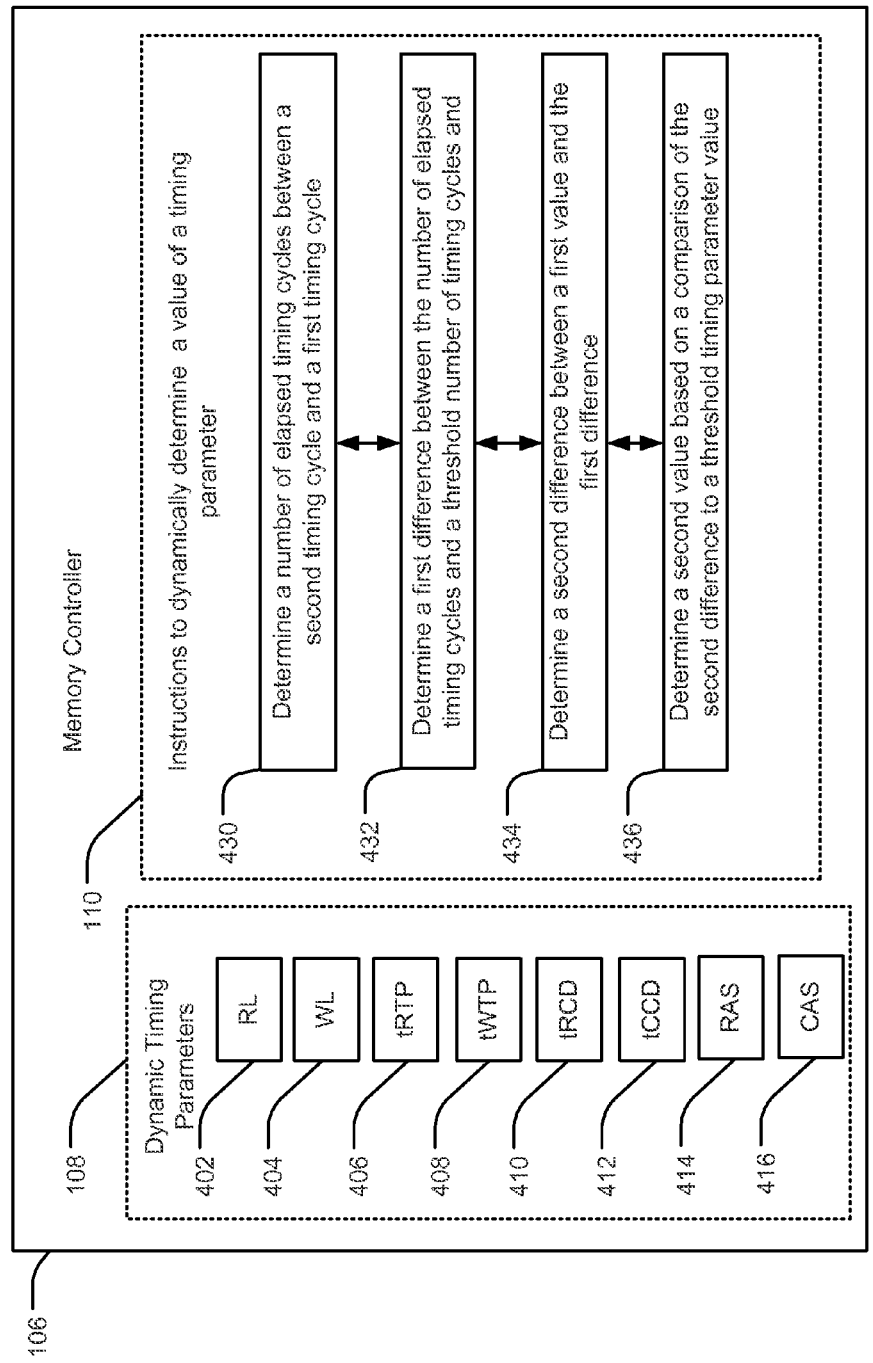
FIG. 4 is a diagram of an embodiment of a memory controller of the system of FIG. 1.

Referring to FIG. 4, a particular illustrative embodiment of a memory controller of the system 100 of FIG. 1 is disclosed. The dynamic timing parameters 126 of the memory controller 106 may include a RL timing parameter 402, a WL timing parameter 404, a tRTP timing parameter 406, a tWTP timing parameter 408, a tRCD timing parameter 410, a tCCD timing parameter 412, a RAS timing parameter 414 (e.g., the RAS delay), a CAS timing parameter 416 (e.g., the CAS delay), or a combination thereof.

The instructions 110 of the memory controller 106 may, when executed by the memory controller 106, cause the memory controller 106 to perform operations including determining a number of elapsed timing cycles between a second timing cycle and a first timing cycle, at 430. The operations may also include determining a first difference between the number of elapsed timing cycles and a threshold number of timing cycles, at 432. The operations may further include determining a second difference between a first value and the first difference, at 434. The operations may also include determining a second value based on a comparison of the second difference to a threshold timing parameter value, at 436.

Figure 5:
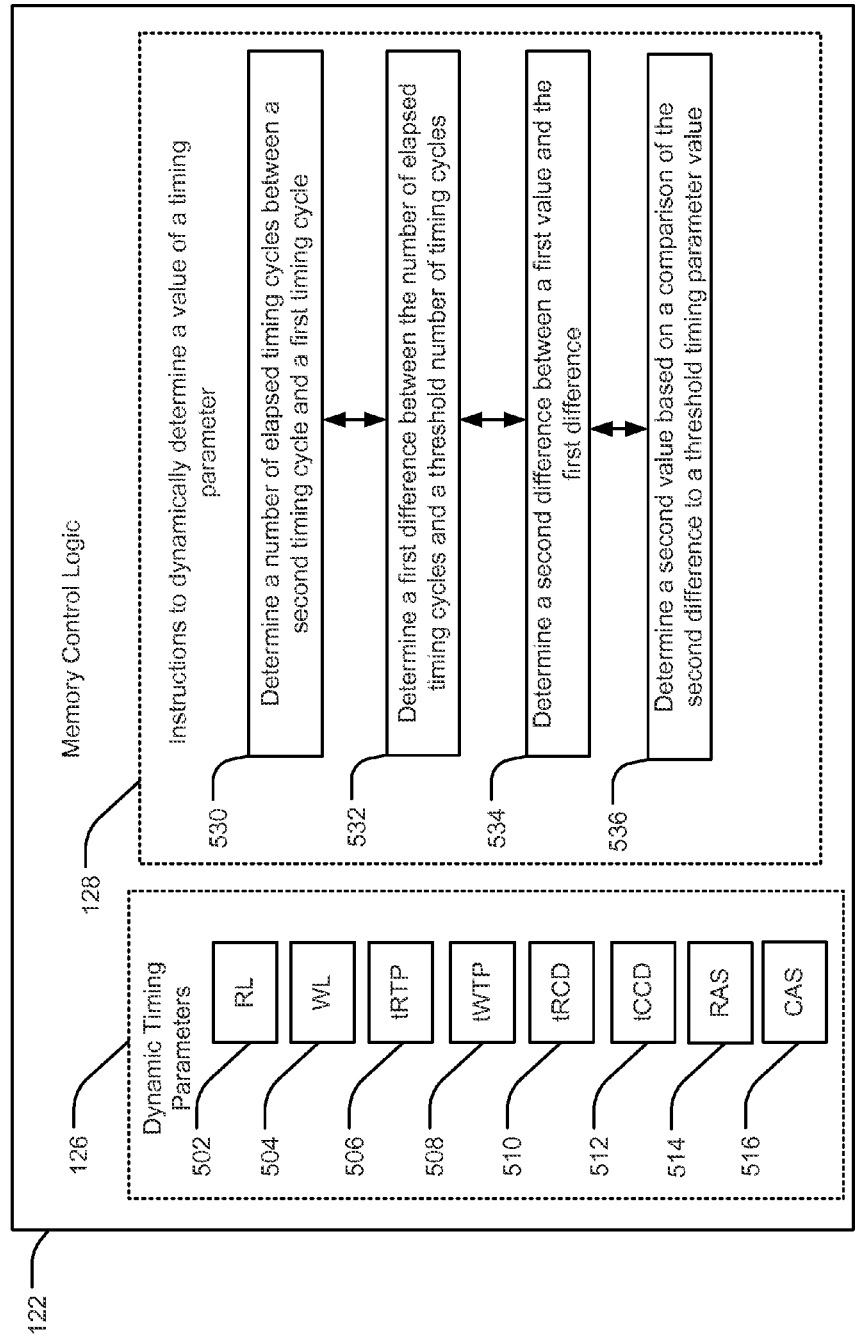
FIG. 5 is a diagram of an embodiment of memory control logic of the system of FIG. 1.

Referring to FIG. 5, a particular illustrative embodiment of memory control logic 122 of the system 100 of FIG. 1 is disclosed. The dynamic timing parameters 126 of the memory control logic 122 may include a RL timing parameter 502, a WL timing parameter 504, a tRTP timing parameter 506, a tWTP timing parameter 508, a tRCD timing parameter 510, a tCCD timing parameter 512, a RAS timing parameter 514, a CAS timing parameter 516, or a combination thereof.

The instructions 128 of the memory control logic 122 may, when executed by the memory control logic 122, cause the memory control logic 122 to perform operations including determining a number of elapsed timing cycles between a second timing cycle and a first timing cycle, at 530. The operations may also include determining a first difference between the number of elapsed timing cycles and a threshold number of timing cycles, at 532. The operations may further include determining a second difference between a first value and the first difference, at 534. The operations may also include determining a second value based on a comparison of the second difference to a threshold timing parameter value, at 536.

Figure 6:
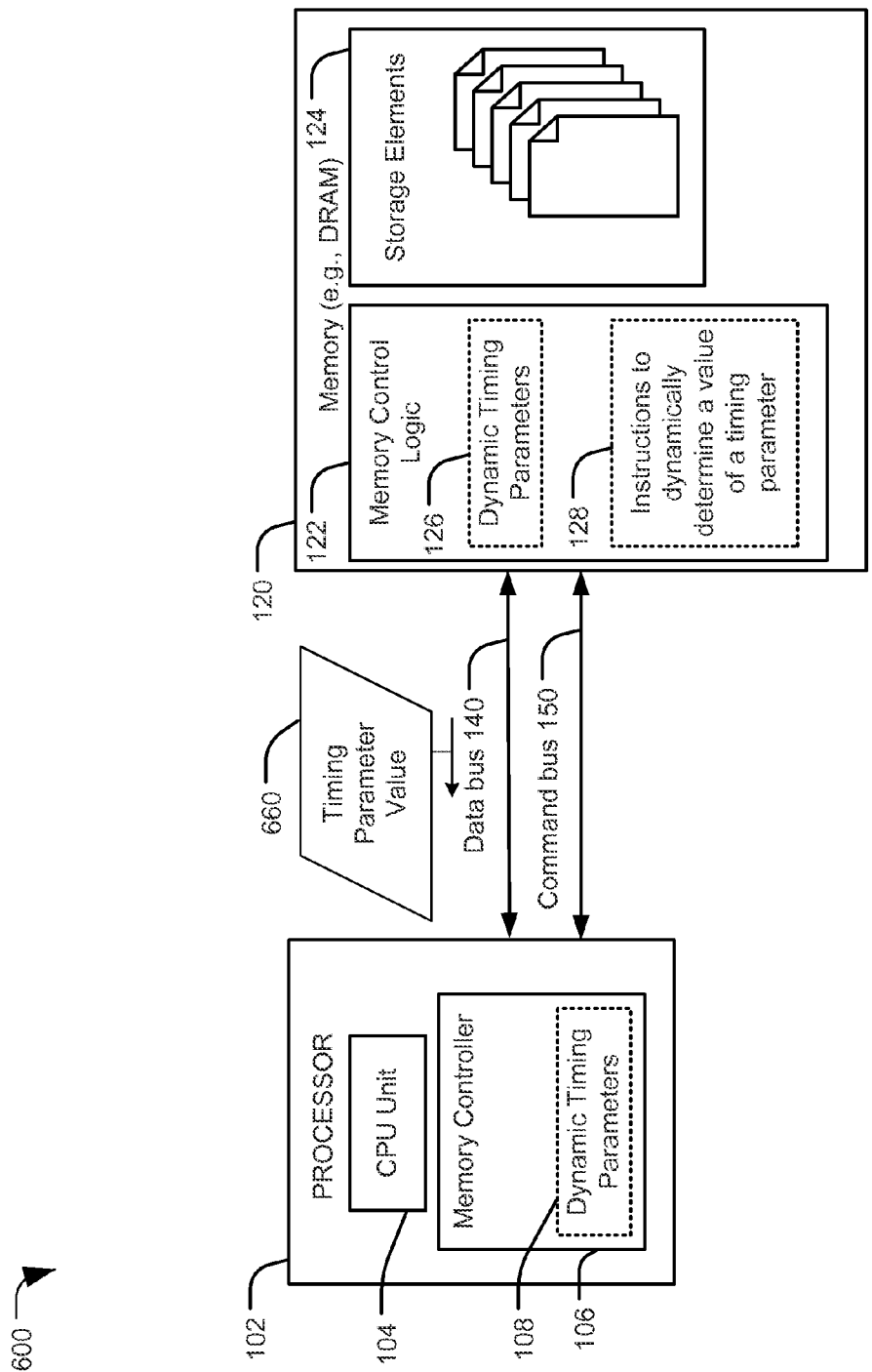
FIG. 6 is a diagram of another particular illustrative embodiment of a system operable to dynamically determine a timing parameter of a memory device.

Referring to FIG. 6, a particular illustrative embodiment of a system operable to dynamically determine a timing parameter of a memory device is disclosed and generally designated 600.

The system 600 may correspond to an alternative embodiment of the system 100 of FIG. 1. In FIG. 1, the memory controller 106 includes the instructions 110 to dynamically determine a value of a timing parameter (e.g., the RL timing parameter), whereas the memory controller 106 in FIG. 6 does not include such instructions. In the system 600, the memory control logic 122 may dynamically determine and transmit the value of timing parameter(s) (e.g., a timing parameter value 660) to the processor 102. The processor 102 may update the dynamic timing parameters 108 based on the timing parameter value 660.

Figure 7:
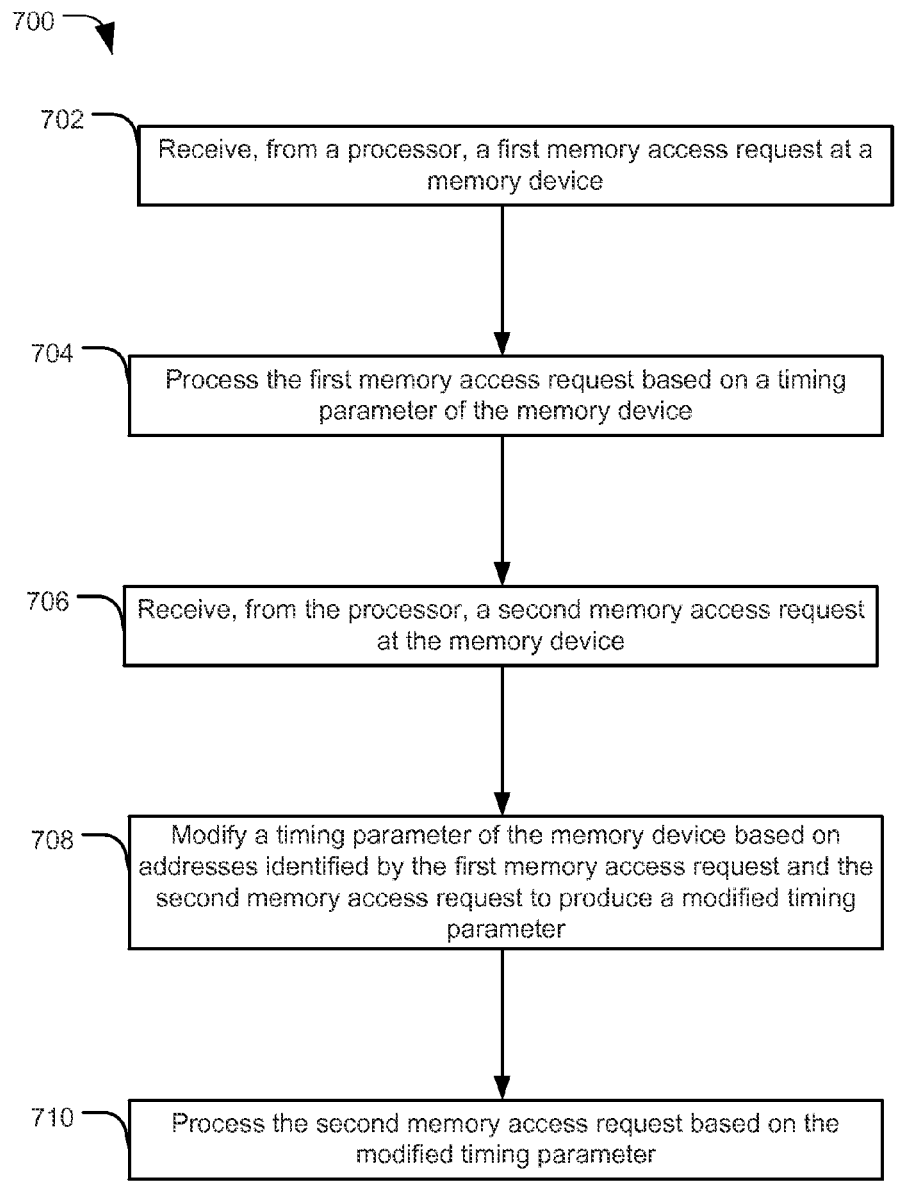
FIG. 7 is a flow chart of a particular illustrative embodiment of a method of dynamically determining a timing parameter of a memory device.

Referring to FIG. 7, a flow chart of a particular illustrative embodiment of a method of dynamically determining a timing parameter of a memory device is depicted and generally designated 700.

The method 700 may include receiving, from a processor, a first memory access request at a memory device, at 702. For example, the memory control logic 122 of FIG. 1 may receive a first memory access request from the processor 102. The first memory access request may correspond to an access of a first storage element of the plurality of storage elements 124. The first storage element may be included in a first row and a first column of the plurality of storage elements 124.

The method 700 may also include processing the first memory access request based on a timing parameter of the memory device, at 704. For example, the memory control logic 122 may process the first memory access request based on a RL timing parameter. The RL timing parameter (e.g., ten (10) timing cycles) may correspond to a RAS delay (e.g., five (5) timing cycles) and a CAS delay (e.g., five (5) timing cycles).

The method 700 may further include receiving, from the processor, a second memory access request at the memory device, at 706. For example, the memory control logic 122 may receive a second memory access request from the processor 102. The second memory access request may correspond to an access of a second storage element of the plurality of storage elements 124. The second storage element may be included in the first row and a second column of the plurality of storage elements 124.

The method 700 may also include modifying a timing parameter of the memory device based on addresses identified by the first memory access request and the second memory access request to produce a modified timing parameter, at 708. For example, the memory control logic 122 may modify the RL timing parameter (e.g., to a value RL') based on the first memory access request and the second memory access request identifying addresses on a same row (i.e., the first row) of the plurality of storage elements 124.

The method 700 may further include processing the second memory access request based on the modified timing parameter, at 710. For example, the memory control logic 122 may process the second memory access request based on the dynamically modified value (i.e., RL') of the RL timing parameter.

Thus, the memory control logic 122 may dynamically modify a timing parameter (e.g., the RL timing parameter) based on addresses indicated by a first memory access request and a second memory access request. The dynamically modified timing parameter may reduce idle timing cycles of a data bus.

The method of FIG. 7 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 700 of FIG. 7 may be performed by a processor that executes instructions, as described with respect to FIGS. 1, 4-6, and 11.

Figure 8:
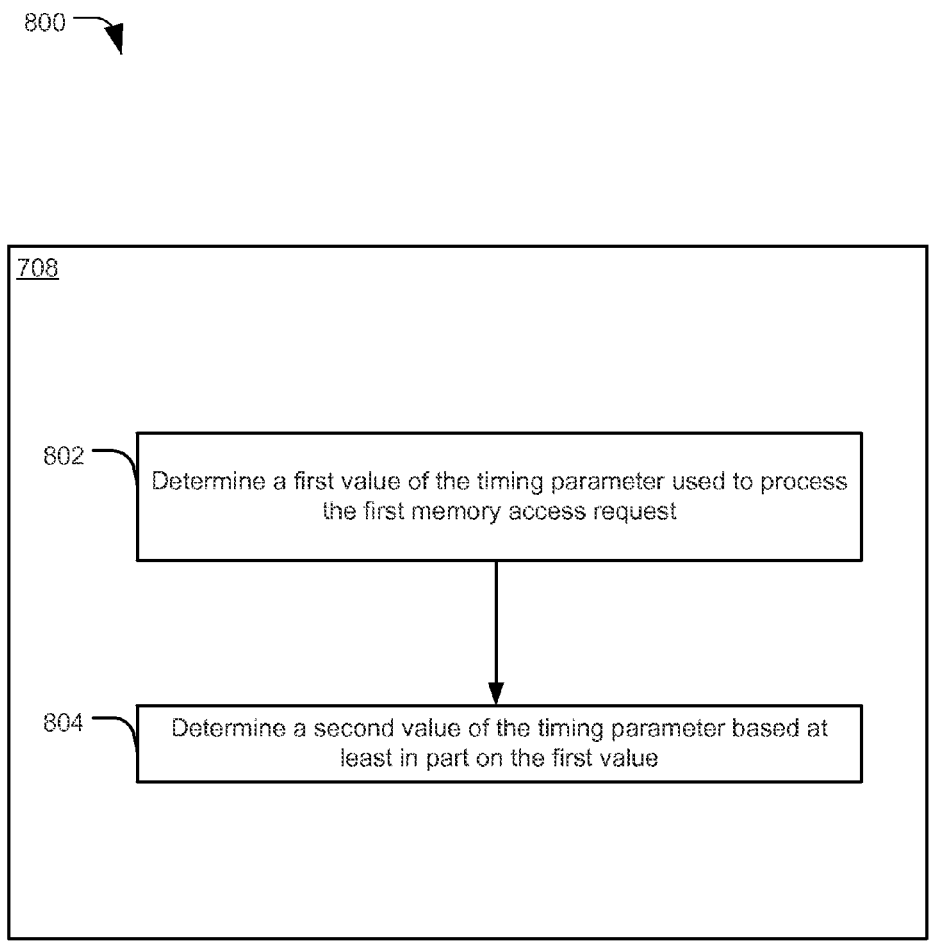
FIG. 8 is a flow chart of a particular illustrative embodiment of a method of dynamically determining a timing parameter of a memory device and may correspond to operation 708 of FIG. 7.

Referring to FIG. 8, a flow chart of a particular illustrative embodiment of a method of dynamically determining a timing parameter of a memory device is depicted and generally designated 800. In a particular embodiment, the method 800 may correspond to operation 708 of FIG. 7.

The method 800 may include determining a first value of the timing parameter used to process the first memory access request, at 802. For example, the memory control logic 122 may determine a first value (e.g., ten (10) timing cycles) of the timing parameter (e.g., the RL timing parameter) based on the RAS delay (e.g., five (5) timing cycles) and the CAS delay (e.g., five (5) timing cycles).

The method 800 may also include determining a second value of the timing parameter based at least in part on the first value, at 804. For example, the memory control logic 122 may determine a second value (e.g., RL') of the timing parameter based at least in part on the first value. To illustrate, the memory control logic 122 may determine RL' based on a second difference between the first value and a first difference. The first difference may correspond to a difference between a number of timing cycles elapsed between the first memory access request and the second memory access request and a threshold number of timing cycles.

The method of FIG. 8 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 900 of FIG. 8 may be performed by a processor that executes instructions, as described with respect to FIGS. 1, 4-6, and 11.

Figure 9:
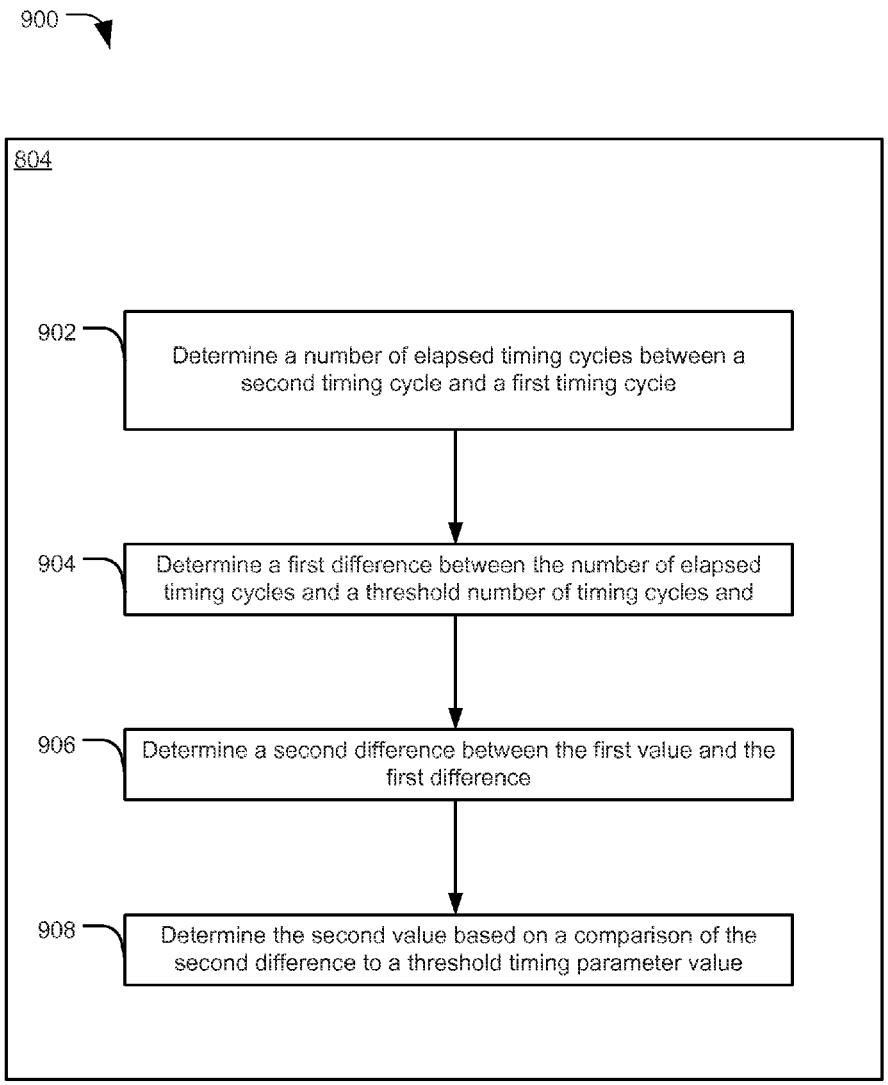
FIG. 9 is a flow chart of a particular illustrative embodiment of a method of dynamically determining a timing parameter of a memory device and may correspond to operation 804 of FIG. 8.

Referring to FIG. 9, a flow chart of a particular illustrative embodiment of a method of dynamically determining a timing parameter of a memory device is depicted and generally designated 900. In a particular embodiment, the method 900 may correspond to operation 804 of FIG. 8.

The method 900 may include determining a number of elapsed timing cycles between a second timing cycle and a first timing cycle, at 902. For example, the memory control logic 122 may determine a number of elapsed timing cycles (e.g., eleven (11) timing cycles) between a second timing cycle (e.g., tCK13) during which the second memory access request is received and a first timing cycle (e.g., tCK2) during which the first memory access request is received.

The method 900 may also include determining a first difference between the number of elapsed timing cycles and a threshold number of timing cycles, at 904. For example, the memory control logic 122 may determine a first difference (x=7) between the number of elapsed timing cycles (i.e., eleven (11)) and a threshold number of timing cycles (e.g., the tCCD timing parameter=four (4) timing cycles).

The method 900 may further include determining a second difference between the first value and the first difference, at 906. For example, the memory control logic 122 may determine the second difference (e.g., 3) between the first value (e.g., ten (10) timing cycles) and the first difference (i.e., 7).

The method 900 may also include determining the second value based on a comparison of the second difference to a threshold timing parameter value, at 908. For example, the memory control logic 122 may determine the second value (i.e., RL') based on a comparison of the second difference (i.e., 3) to the CAS delay (e.g., five (5) timing cycles). To illustrate, the memory control logic 122 may use the higher of the second difference and the CAS delay as the second value (e.g., five (5) timing cycles).

The method of FIG. 9 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 900 of FIG. 9 may be performed by a processor that executes instructions, as described with respect to FIGS. 1, 4-6, and 11.

Figure 10:
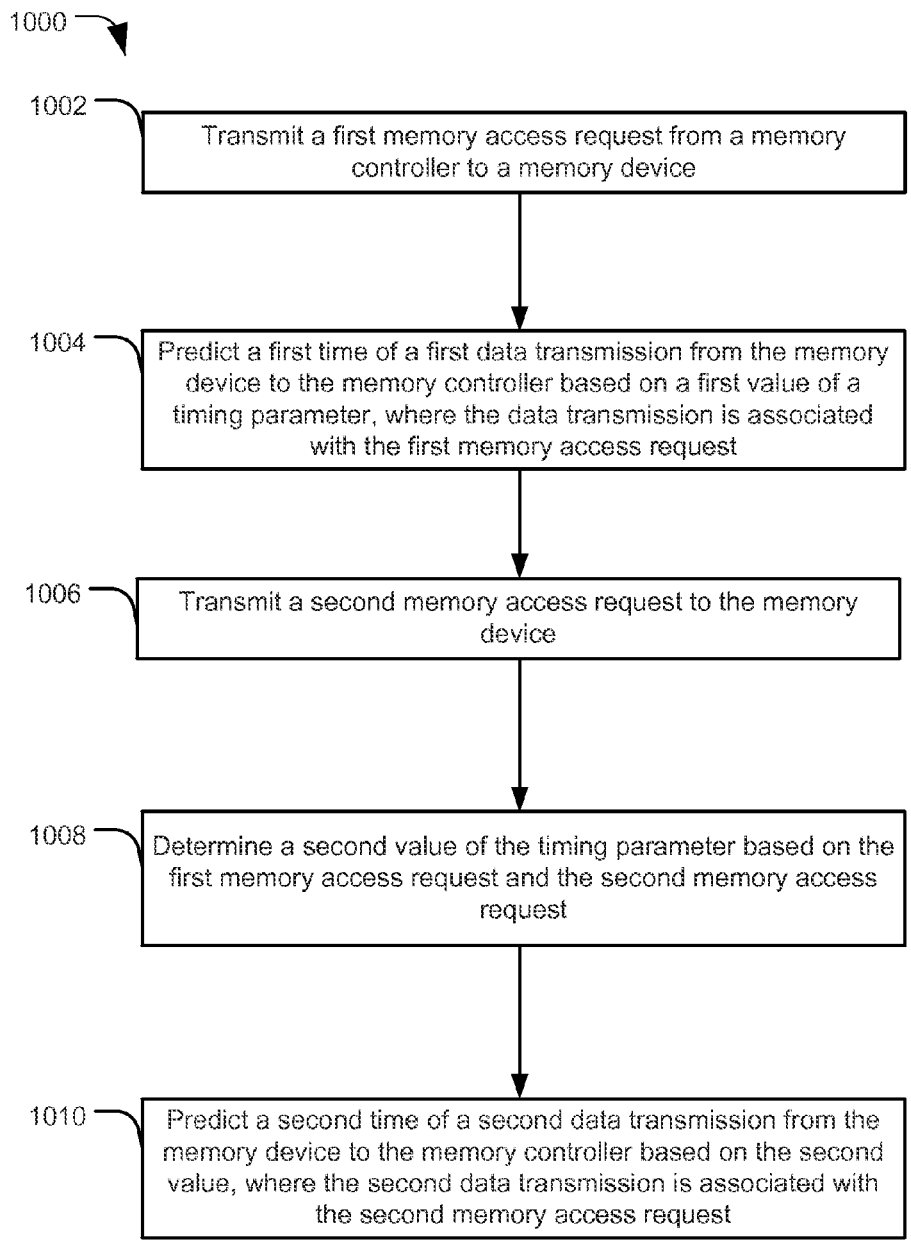
FIG. 10 is a flow chart of another particular illustrative embodiment of a method of dynamically determining a timing parameter of a memory device.

Referring to FIG. 10, a flow chart of a particular illustrative embodiment of a method of dynamically determining a timing parameter of a memory device is depicted and generally designated 1000.

The method 1000 may include transmitting a first memory access request from a memory controller to a memory device, at 1002. For example, the memory controller 106 of FIG. 1 may transmit a first memory access request to the memory 120 during the timing cycle tCK2.

The method 1000 may also include predicting a first time of a first data transmission from the memory device to the memory controller based on a first value of a timing parameter, where the data transmission is associated with the first memory access request, at 1004. For example, the memory controller 106 of FIG. 1 may predict a first time of a first data transmission from the memory 120 to the memory controller 106 based on a first value of the RL timing parameter. To illustrate, the memory controller 106 may predict transmission of first data from the memory 120 to the memory controller 106 to begin during the timing cycle tCK12 (i.e., timing cycle 12) based on a sum of the timing cycle tCK2 (i.e., timing cycle 2) during which the first memory access request is transmitted to the memory 120 and the first value of the RL timing parameter of ten (10) timing cycles.

The method 1000 may further include transmitting a second memory access request to the memory device, at 1006. For example, the memory controller 106 may transmit a second memory access to the memory 120 during tCK13.

The method 1000 may also include determining a second value of the timing parameter based on the first memory access request and the second memory access request, at 1008. For example, the memory controller 106 may determine a second value (e.g., RL'=5) of the timing parameter based on the first memory access request and the second memory access request.

The method 1000 may further include predicting a second time of a second data transmission from the memory device to the memory controller based on the second value, where the second data transmission is associated with the second memory access request, at 1010. For example, the memory controller 106 may predict transmission of second data from the memory 120 to the memory controller 106 to begin during the timing cycle tCK18 (i.e., timing cycle 18) based on a sum of the timing cycle tCK13 (i.e., timing cycle 13) during which the second memory access request is transmitted to the memory 120 and the second value of the RL timing parameter value of five (5) timing cycles (i.e., RL'=5).

The method of FIG. 10 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the method 1000 of FIG. 10 may be performed by a processor that executes instructions, as described with respect to FIGS. 1, 4-6, and 11.

Figure 11:
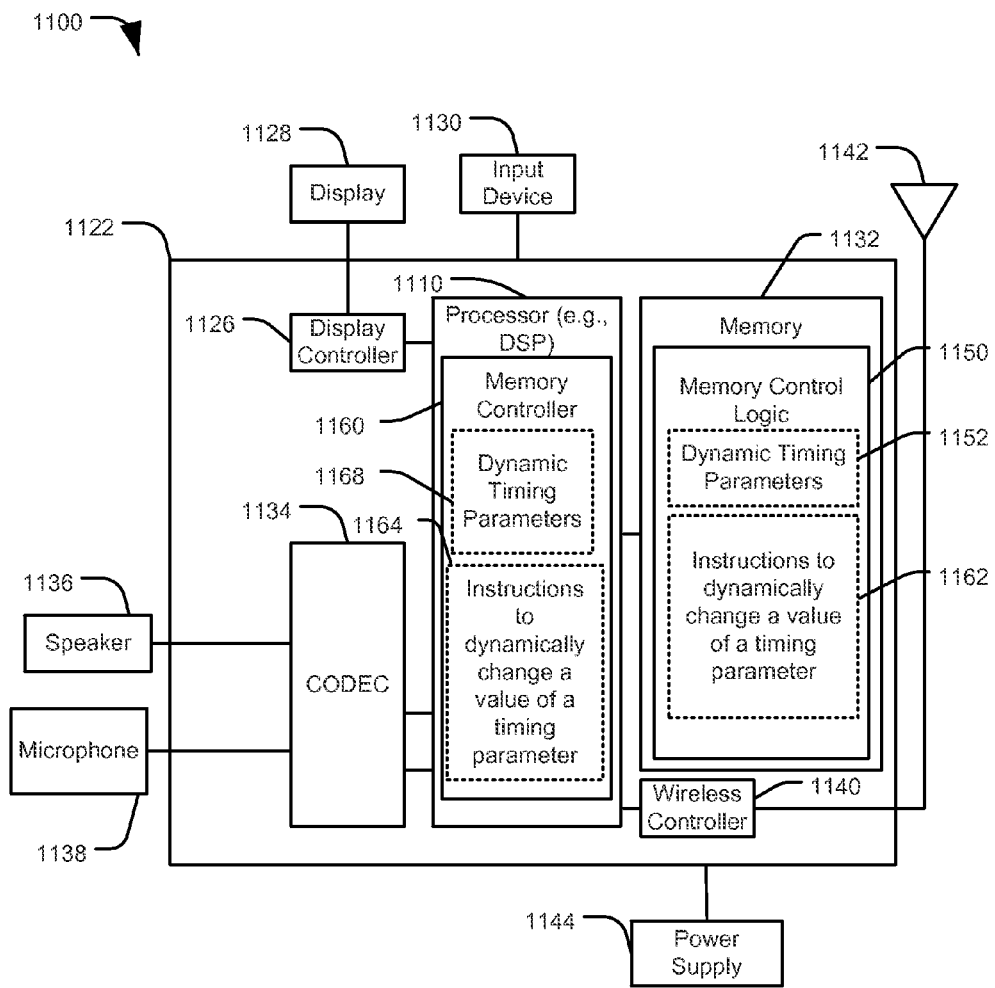
FIG. 11 is a block diagram of a wireless communication device including components configured to dynamically determine a timing parameter of a memory device.

Referring to FIG. 11, a block diagram of a particular illustrative embodiment of a wireless communication device is depicted and generally designated 1100. The device 1100 includes a processor 1110, such as a digital signal processor (DSP), coupled to a memory 1132 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art). In an illustrative embodiment, the processor 1110 may correspond to the processor 102 of FIG. 1, the memory 1132 may correspond to the memory 120 of FIG. 1, or both.

The processor 1110 includes a memory controller 1160. The memory controller 1160 may store instructions 1164 executable by the memory controller 1160, the processor 1110, or both. The memory controller 1160 may store dynamic timing parameters 1168. In an illustrative embodiment, the memory controller 1160 may correspond to the memory controller 106 of FIG. 1, the dynamic timing parameters 1168 may correspond to the dynamic timing parameters 108 of FIG. 1, the instructions 1164 may correspond to the instructions 110 of FIG. 1, or a combination thereof.

The memory 1132 may include or be coupled to memory control logic 1150. The memory control logic 1150 may include instructions 1162 executable by the memory control logic 1150. The memory control logic 1150 may include dynamic timing parameters 1152 accessible to the processor 1110. In an illustrative embodiment, the memory control logic 1150 may correspond to the memory control logic 122 of FIG. 1, the dynamic timing parameters 1152 may correspond to the dynamic timing parameters 126 of FIG. 1, the instructions 1162 may correspond to the instructions 128 of FIG. 1, or a combination thereof.

FIG. 11 also shows a display controller 1126 that is coupled to the processor 1110 and to a display 1128. A coder/decoder (CODEC) 1134 may also be coupled to the processor 1110. A speaker 1136 and a microphone 1138 may be coupled to the CODEC 1134. FIG. 11 also indicates that a wireless controller 1140 may be coupled to the processor 1110 and may be further coupled to a wireless antenna 1142.

In a particular embodiment, the processor 1110, the display controller 1126, the memory 1132, the CODEC 1134, and the wireless controller 1140 are included in a system-in-package or system-on-chip device 1122. In a particular embodiment, an input device 1130 and a power supply 1144 are coupled to the system-on-chip device 1122. Moreover, in a particular embodiment, as illustrated in FIG. 11, the display 1128, the input device 1130, the speaker 1136, the microphone 1138, the wireless antenna 1142, and the power supply 1144 are external to the system-on-chip device 1122. However, each of the display 1128, the input device 1130, the speaker 1136, the microphone 1138, the wireless antenna 1142, and the power supply 1144 may be coupled to a component of the system-on-chip device 1122, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then integrated into electronic devices, as described further with reference to FIG. 12.

Figure 12:
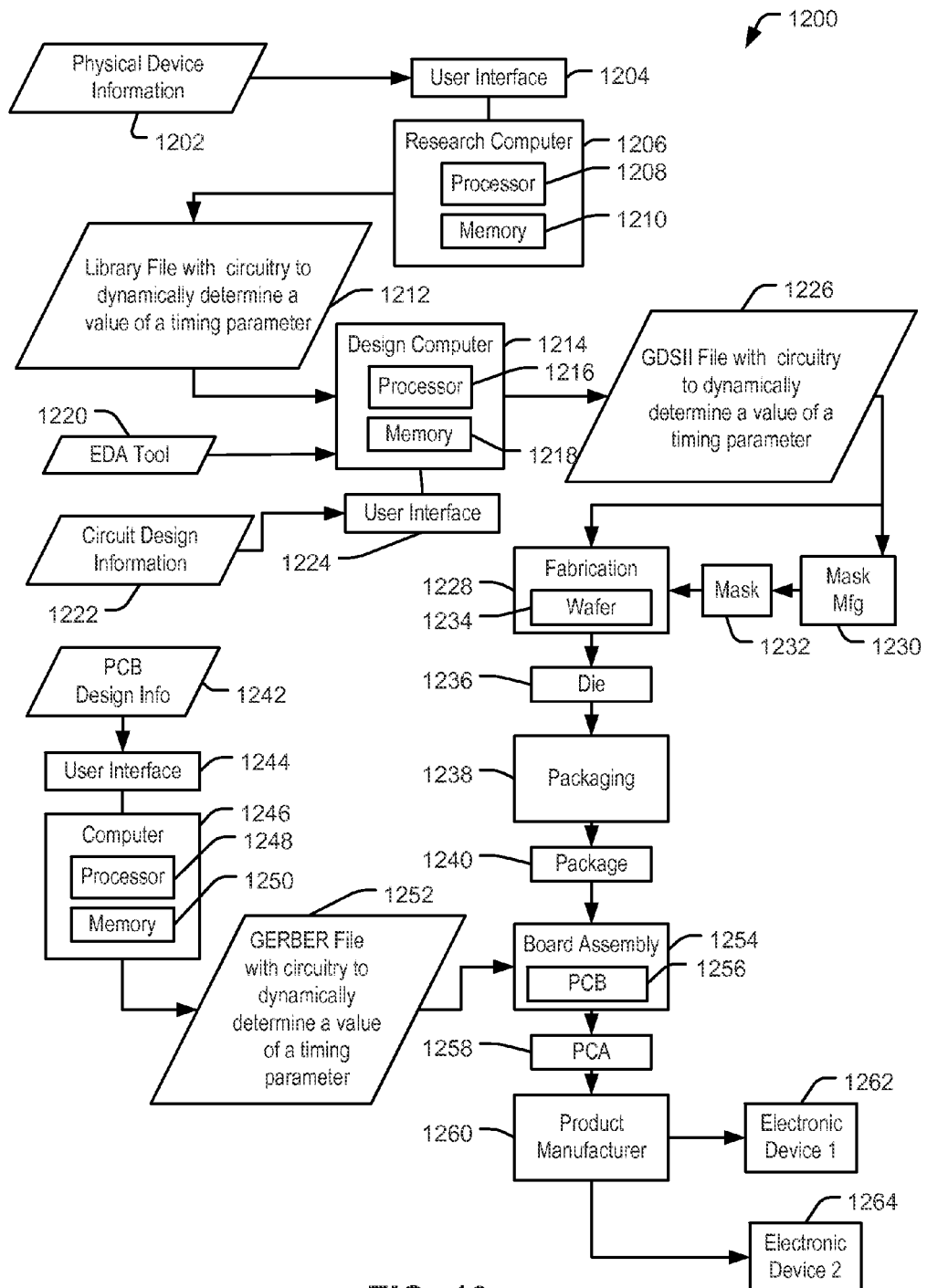
FIG. 12 is a data flow diagram of a particular illustrative embodiment of a manufacturing process to manufacture electronic devices that include components configured to dynamically determine a timing parameter of a memory device.

Referring to FIG. 12, a particular illustrative embodiment of an electronic device manufacturing process is depicted and generally designated 1200. In FIG. 12, physical device information 1202 is received at the manufacturing process 1200, such as at a research computer 1206. The physical device information 1202 may include design information representing at least one physical property of a semiconductor device, such as a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 1). For example, the physical device information 1202 may include physical parameters, material characteristics, and structure information that is entered via a user interface 1204 coupled to the research computer 1206. The research computer 1206 includes a processor 1208, such as one or more processing cores, coupled to a computer readable medium such as a memory 1210. The memory 1210 may store computer readable instructions that are executable to cause the processor 1208 to transform the physical device information 1202 to comply with a file format and to generate a library file 1212.

In a particular embodiment, the library file 1212 includes at least one data file including the transformed design information. For example, the library file 1212 may include a library of circuits including a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11) provided for use with an electronic design automation (EDA) tool 1220.

The library file 1212 may be used in conjunction with the EDA tool 1220 at a design computer 1214 including a processor 1216, such as one or more processing cores, coupled to a memory 1218. The EDA tool 1220 may be stored as processor executable instructions at the memory 1218 to enable a user of the design computer 1214 to design a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11) using the library file 1212. For example, a user of the design computer 1214 may enter circuit design information 1222 via a user interface 1224 coupled to the design computer 1214. The circuit design information 1222 may include design information representing at least one physical property of a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11). To illustrate, the circuit design property may include identification of particular circuits and relationships to other elements in a circuit design, positioning information, feature size information, interconnection information, or other information representing a physical property of a semiconductor device.

The design computer 1214 may be configured to transform the design information, including the circuit design information 1222, to comply with a file format. To illustrate, the file formation may include a database binary file format representing planar geometric shapes, text labels, and other information about a circuit layout in a hierarchical format, such as a Graphic Data System (GDSII) file format. The design computer 1214 may be configured to generate a data file including the transformed design information, such as a GDSII file 1226 that includes information describing a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11) in addition to other circuits or information. To illustrate, the data file may include information corresponding to a system-on-chip (SOC) that includes a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11), and that also includes additional electronic circuits and components within the SOC.

The GDSII file 1226 may be received at a fabrication process 1228 to manufacture a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11), according to transformed information in the GDSII file 1226. For example, a device manufacture process may include providing the GDSII file 1226 to a mask manufacturer 1230 to create one or more masks, such as masks to be used with photolithography processing, illustrated as a representative mask 1232. The mask 1232 may be used during the fabrication process to generate one or more wafers 1234, which may be tested and separated into dies, such as a representative die 1236. The die 1236 includes a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11).

The die 1236 may be provided to a packaging process 1238 where the die 1236 is incorporated into a representative package 1240. For example, the package 1240 may include the single die 1236 or multiple dies, such as a system-in-package (SiP) arrangement. The package 1240 may be configured to conform to one or more standards or specifications, such as Joint Electron Device Engineering Council (JEDEC) standards.

Information regarding the package 1240 may be distributed to various product designers, such as via a component library stored at a computer 1246. The computer 1246 may include a processor 1248, such as one or more processing cores, coupled to a memory 1250. A printed circuit board (PCB) tool may be stored as processor executable instructions at the memory 1250 to process PCB design information 1242 received from a user of the computer 1246 via a user interface 1244. The PCB design information 1242 may include physical positioning information of a packaged semiconductor device on a circuit board, the packaged semiconductor device corresponding to the package 1240 including a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11).

The computer 1246 may be configured to transform the PCB design information 1242 to generate a data file, such as a GERBER file 1252 with data that includes physical positioning information of a packaged semiconductor device on a circuit board, as well as layout of electrical connections such as traces and vias, where the packaged semiconductor device corresponds to the package 1240 including a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11). In other embodiments, the data file generated by the transformed PCB design information may have a format other than a GERBER format.

The GERBER file 1252 may be received at a board assembly process 1254 and used to create PCBs, such as a representative PCB 1256, manufactured in accordance with the design information stored within the GERBER file 1252. For example, the GERBER file 1252 may be uploaded to one or more machines to perform various steps of a PCB production process. The PCB 1256 may be populated with electronic components including the package 1240 to form a representative printed circuit assembly (PCA) 1258.

The PCA 1258 may be received at a product manufacture process 1260 and integrated into one or more electronic devices, such as a first representative electronic device 1262 and a second representative electronic device 1264. As an illustrative, non-limiting example, the first representative electronic device 1262, the second representative electronic device 1264, or both, may be selected from the group of a cellular phone, a wireless local area network (LAN) device, a set top box, a music player, a video player, an entertainment unit, a navigation device, a communications device, a personal digital assistant (PDA), a fixed location data unit, and a computer, into which a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11) is integrated. As another illustrative, non-limiting example, one or more of the electronic devices 1262 and 1264 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 12 illustrates remote units according to teachings of the disclosure, the disclosure is not limited to these illustrated units. Embodiments of the disclosure may be suitably employed in any device which includes active integrated circuitry including memory and on-chip circuitry.

A device that includes a circuit configured to dynamically determine a timing parameter (e.g., the memory controller 106 of FIG. 1, the memory control logic 122 of FIG. 1, the memory controller 1160 of FIG. 11, and/or the memory control logic 1150 of FIG. 11) may be fabricated, processed, and incorporated into an electronic device, as described in the illustrative process 1200. One or more aspects of the embodiments disclosed with respect to FIGS. 1-12 may be included at various processing stages, such as within the library file 1212, the GDSII file 1226, and the GERBER file 1252, as well as stored at the memory 1210 of the research computer 1206, the memory 1218 of the design computer 1214, the memory 1250 of the computer 1246, the memory of one or more other computers or processors (not shown) used at the various stages, such as at the board assembly process 1254, and also incorporated into one or more other physical embodiments such as the mask 1232, the die 1236, the package 1240, the PCA 1258, other products such as prototype circuits or devices (not shown), or any combination thereof. Although various representative stages are depicted with reference to FIGS. 1-12, in other embodiments fewer stages may be used or additional stages may be included. Similarly, the process 1200 of FIG. 12 may be performed by a single entity or by one or more entities performing various stages of the process 1200.

In conjunction with the described embodiments, an apparatus is disclosed that includes means for storing data. For example, the means for storing data may include the memory 120 of FIG. 1, the memory 1132 of FIG. 11, or both. The apparatus also includes means for dynamically determining a value of a timing parameter at least partially based on memory addresses identified by a plurality of memory access requests received from a processor, where the timing parameter corresponds to a first number of timing cycles before data associated with at least one of the plurality of memory access requests is provided to a data bus. For example, the means for dynamically determining the value of a timing parameter may include the memory control logic 122 of FIG. 1, the memory control logic 1150 of FIG. 11, or both.

The apparatus may further include means for transmitting the value of the timing parameter to the processor. For example, the means for transmitting may include the data bus 140 of FIG. 1. The apparatus may also include means for receiving one or more memory access requests. For example, the means for receiving may include the data bus 140 of FIG. 1. The apparatus may further include means for processing the one or more memory access requests. For example, the means for processing may include the memory control logic 122 of FIG. 1, the memory control logic 1150 of FIG. 11, or both.

In a particular embodiment, the means for dynamically determining the value of the timing parameter may include means for determining a first value of the timing parameter based on a first memory access request. The means for processing the one or more memory access requests processes the first memory access request based on the first value. For example, the means for determining the first value of the timing parameter may include the memory control logic 122 of FIG. 1, the memory control logic 1150 of FIG. 11, or both.

The means for dynamically determining the value of the timing parameter may also include means for determining a second value of the timing parameter based at least in part on the first memory access request and a second memory access request. The means for processing the one or more memory access requests processes the second memory access request based on the second value. For example, the means for determining the second value of the timing parameter may include the memory control logic 122 of FIG. 1, the memory control logic 1150 of FIG. 11, or both.

In conjunction with the described embodiments, another apparatus is disclosed that includes means for processing data. For example, the means for processing data may include the CPU 104 of FIG. 1, the processor 1110 of FIG. 11, or both. The apparatus also includes means for dynamically determining a value of a timing parameter at least partially based on memory addresses identified by a plurality of transmitted memory access requests, wherein the timing parameter corresponds to a first number of timing cycles before data associated with at least one of the plurality of transmitted memory access requests is received from a data bus. For example, the means for dynamically determining the value of a timing parameter may include the memory controller 106 of FIG. 1, the memory controller 1160 of FIG. 11, or both.

In a particular embodiment, the means for dynamically determining the value of the timing parameter may include means for determining a first value of the timing parameter based on the first memory access request. For example, the means for determining the first value of the timing parameter may include the memory controller 106 of FIG. 1, the memory controller 1160 of FIG. 11, or both.

The means for dynamically determining the value of the timing parameter may further include means for determining a second number of elapsed timing cycles between the second timing cycle and the first timing cycle. For example, the means for determining the second number of elapsed timing cycles between the second timing cycle and the first timing cycle may include the memory controller 106 of FIG. 1, the memory controller 1160 of FIG. 11, or both.

The means for dynamically determining the value of the timing parameter may also include means for determining a first difference between the second number of elapsed timing cycles and a threshold number of timing cycles. For example, the means for determining the first difference between the second number of elapsed timing cycles and a threshold number of timing cycles may include the memory controller 106 of FIG. 1, the memory controller 1160 of FIG. 11, or both.

The means for dynamically determining the value of the timing parameter may further include means for determining a second difference between the first value and the first difference. For example, the means for determining the second difference between the first value and the first difference may include the memory controller 106 of FIG. 1, the memory controller 1160 of FIG. 11, or both.

The means for dynamically determining the value of the timing parameter may also include means for determining a second value of the timing parameter based on a comparison of the second difference to a threshold timing parameter value. For example, the means for determining the second value based on a comparison of the second difference to the threshold timing parameter value may include the memory controller 106 of FIG. 1, the memory controller 1160 of FIG. 11, or both.

The apparatus may further include means for transmitting a first memory access request and a second memory access request to a memory device. For example, the means for transmitting may include the data bus 140 of FIG. 1.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor may read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   receiving, by a memory device from a processor, a first memory access request identifying a first row of a plurality of storage elements of the memory device;
   processing the first memory access request based on a timing parameter of the memory device;
   receiving, by the memory device from the processor, a second memory access request identifying the first row of the plurality of storage elements;
   modifying the timing parameter of the memory device to produce a modified timing parameter in response to determining that the first memory access request and the second memory access request each identify the first row of the plurality of storage elements; and
   processing the second memory access request based on the modified timing parameter.

2. The method of claim 1, wherein the memory device is one of a double data rate (DDR) synchronous dynamic random access memory (SDRAM), a non-volatile random access memory (NVRAM), or a dynamic random access memory (DRAM), and wherein the first memory access request and the second memory access request each include a corresponding row address identifying the first row of the plurality of storage elements.

3. The method of claim 1, wherein modifying the timing parameter includes:
   determining a first value of the timing parameter used to process the first memory access request; and
   determining a second value of the timing parameter based at least in part on the first value.

4. The method of claim 3, wherein the first value corresponds to a sum of a row access latency and a column access latency and wherein the second value corresponds to the column access latency when a row address is unchanged.

5. The method of claim 4, wherein the plurality of storage elements are arranged in a plurality of rows and a plurality of columns, wherein the first memory access request corresponds to a request to access a first storage element of the memory device, wherein the first storage element is included in a first row of the plurality of rows and a first column of the plurality of columns, wherein the second memory access request corresponds to a request to access a second storage element of the memory device, wherein the second storage element is included in the first row and in a second column that is different from the first column.

6. The method of claim 5, wherein a number of rows included in the plurality of rows of the memory device is different than a number of columns included in the plurality of columns of the memory device.

7. The method of claim 5, wherein the first memory access request includes a row command and a column command, wherein the row command includes a first portion of a row address of the first row, and wherein the column command includes a second portion of the row address of the first row and a column address of the first column.

8. The method of claim 7, wherein the second memory access request includes a second column command, wherein the second column command includes the second portion of the row address and a column address of the second column.

9. The method of claim 3, wherein the first memory access request is received during a first timing cycle, wherein the second memory access request is received during a second timing cycle, and wherein determining the second value includes:
   determining a number of elapsed timing cycles between the second timing cycle and the first timing cycle;
   determining a first difference between the number of elapsed timing cycles and a threshold number of timing cycles;
   determining a second difference between the first value and the first difference; and
   determining the second value based on a comparison of the second difference to a threshold timing parameter value.

10. The method of claim 9, wherein the threshold number of timing cycles corresponds to a column-to-column delay.

11. The method of claim 9, wherein the second value corresponds to a greater of the second difference and the threshold timing parameter value, and wherein the threshold timing parameter value corresponds to a column access latency.

12. The method of claim 1, wherein the first memory access request corresponds to one of a first read command or a first write command, and wherein the second memory access request corresponds to one of a second read command, a second write command, or a precharge command.

13. A memory device comprising:
   a plurality of storage elements; and
   memory control logic coupled to the plurality of storage elements and configured to be coupled to a processor, wherein the memory control logic is configured to modify a value of a timing parameter in response to determining that a plurality of memory access requests received from the processor identify a first row of the plurality of storage elements, wherein the timing parameter corresponds to a number of timing cycles before data associated with at least one of the plurality of memory access requests is provided to a data bus.

14. The memory device of claim 13, wherein, to modify the value of the timing parameter, the memory logic is configured to:
   receive, from the processor, a first memory access request at the memory device;
   process the first memory access request based on a first value of the timing parameter of the memory device;
   receive, from the processor, a second memory access request at the memory device;
   determine a second value of the timing parameter of the memory device based at least in part on a first memory address identified by the first memory access request and a second memory address identified by the second memory access request; and
   process the second memory access request based on the second value.

15. The memory device of claim 14, wherein the first value corresponds to a row access latency and a column access latency, and wherein the second value corresponds to the column access latency when a row address included in the second memory access request corresponds to a row address included in the first memory access request.

16. The memory device of claim 14, wherein the first memory access request is received during a first timing cycle, wherein the second memory access request is received during a second timing cycle, and wherein, to determine the second value, the memory logic is configured to:
   determine a number of elapsed timing cycles between the second timing cycle and the first timing cycle;
   determine a first difference between the number of elapsed timing cycles and a threshold number of timing cycles;
   determine a second difference between the first value and the first difference; and
   determine the second value based on a comparison of the second difference to a threshold timing parameter value,
   wherein the second value corresponds to a greater of the second difference and the threshold timing parameter value, and
   wherein the threshold timing parameter value corresponds to a column access latency.

17. The memory device of claim 16, wherein the threshold number of timing cycles corresponds to a column-to-column delay.

18. The memory device of claim 16, wherein the threshold timing parameter value corresponds to a column access delay.

19. The memory device of claim 13, wherein the memory device is one of a double data rate (DDR) synchronous dynamic random access memory (SDRAM), a non-volatile random access memory (NVRAM), or a dynamic random access memory (DRAM).

20. The memory device of claim 13, wherein the memory control logic is further configured to provide the value of the timing parameter to the processor.

21. An apparatus comprising:
   a memory device including a plurality of storage elements;
   a processor; and
   a memory controller coupled to the processor and to the memory device, wherein the memory controller is configured to modify a value of a timing parameter in response to determining that a plurality of memory access requests to the memory device identify a first row of the plurality of storage elements, wherein the timing parameter corresponds to a number of timing cycles before data associated with at least one of the plurality of memory access requests is provided to a data bus.

22. The apparatus of claim 21, wherein, to modify the value of the timing parameter, the memory controller is configured to:
   initiate transmission of a first memory access request to the memory device;
   predict a first time of a first data transmission from the memory device to the memory controller based on a first value of the timing parameter, wherein the first data transmission is associated with the first memory access request;
   initiate transmission of a second memory access request to the memory device;
   determine a second value of the timing parameter based on the first memory access request and the second memory access request; and
   predict a second time of a second data transmission from the memory device to the memory controller based on the second value, wherein the second data transmission is associated with the second memory access request.

23. The apparatus of claim 22, wherein the first memory access request is transmitted during a first timing cycle, wherein the second memory access request is transmitted during a second timing cycle, and wherein, to determine the second value of the timing parameter based on the first memory access request and the second memory access request, the memory controller is configured to:
   determine a number of elapsed timing cycles between the second timing cycle and the first timing cycle;
   determine a first difference between the number of elapsed timing cycles and a threshold number of timing cycles;
   determine a second difference between the first value and the first difference; and
   determine the second value based on a comparison of the second difference to a threshold timing parameter value,
   wherein the second value corresponds to a greater of the second difference and the threshold timing parameter value, and
   wherein the threshold timing parameter value corresponds to a column access latency.

24. The apparatus of claim 22, wherein the plurality of storage elements are arranged into a plurality of rows and a plurality of columns, wherein a particular storage element, of the plurality of storage elements, is addressable using a particular row address and a particular column address, wherein the particular row address identifies a particular row of the plurality of rows that includes the particular storage element, and wherein the particular column address identifies a particular column of the plurality of columns that includes the particular storage element.

25. The apparatus of claim 24, wherein the first memory access request is associated with a first storage element of the plurality of storage elements, wherein the first memory access request includes a row command and a column command, wherein the row command includes a first portion of a row address corresponding to a first row of the plurality of rows that includes the first storage element, and wherein the column command includes a second portion of the row address of the first row and a column address corresponding to a first column of the plurality of columns that includes the first storage element, wherein the second memory access request is associated with a second storage element of the plurality of storage elements, wherein the second memory access request includes a second column command, and wherein the second column command includes the second portion of the row address of the first row and a second column address corresponding to a second column of the plurality of columns that includes the second storage element.

26. The apparatus of claim 21, wherein, to modify the value of the timing parameter, the memory controller is configure to:
   receive a first value from the memory device;
   receive a second value from the memory device; and
   determine the value of the timing parameter based on a comparison of the first value and the second value, wherein the value of the timing parameter corresponds to the second value when the first value is less than the second value, and wherein the first value is generated at the memory device based on a first memory access request.

27. A method comprising:
   transmitting a first memory access request from a memory controller to a memory device including a plurality of storage elements;
   predicting a first time of a first data transmission from the memory device to the memory controller based on a first value of a timing parameter, wherein the first data transmission is associated with the first memory access request;
   transmitting a second memory access request to the memory device;
   modifying the timing parameter by determining a second value of the timing parameter in response to determining that the first memory access request and the second memory access request each identify a first row of the plurality of storage elements; and
   predicting a second time of a second data transmission from the memory device to the memory controller based on the second value, wherein the second data transmission is associated with the second memory access request.

28. The method of claim 27, wherein the first memory access request is transmitted during a first timing cycle, wherein the second memory access request is transmitted during a second timing cycle, and wherein determining the second value of the timing parameter includes:
   determining a number of elapsed timing cycles between the second timing cycle and the first timing cycle;
   determining a first difference between the number of elapsed timing cycles and a threshold number of timing cycles;
   determining a second difference between the first value and the first difference; and
   determining the second value based on a comparison of the second difference to a threshold timing parameter value,
   wherein the second value corresponds to a greater of the second difference and the threshold timing parameter value, and
   wherein the threshold timing parameter value corresponds to a column access latency.

29. The method of claim 27, further comprising receiving the first value of the timing parameter and the second value of the timing parameter from the memory device.

30. A computer-readable storage device storing instructions that, when executed by a processor, cause the processor to:
   process a first memory access request based on a first value of a timing parameter;
   modify the timing parameter based at least in part on in response to determining that the first memory access request and a second memory access request identify a first row of a plurality of storage elements to produce a modified timing parameter, wherein the modified timing parameter has a second value; and
   process the second memory access request based on the second value.

31. The computer-readable storage device of claim 30, wherein the first memory access request is received during a first timing cycle, wherein the second memory access request is received during a second timing cycle, and wherein the instructions to modify the timing parameter further cause the processor to:
   determine a number of elapsed timing cycles between the second timing cycle and the first timing cycle;
   determine a first difference between the number of elapsed timing cycles and a threshold number of timing cycles;
   determine a second difference between the first value and the first difference; and
   determine the second value based on a comparison of the second difference to a threshold timing parameter value,
   wherein the second value corresponds to a greater of the second difference and the threshold timing parameter value, and
   wherein the threshold timing parameter value corresponds to a column access latency.

32. The computer-readable storage device of claim 31, wherein the threshold number of timing cycles corresponds to a column-to-column delay.

33. The computer-readable storage device of claim 30, wherein the first memory access request and the second memory access request are received at memory control logic of a memory device, and wherein the instructions further comprise instructions that, when executed by the processor, cause the processor to initiate sending at least one of the first value and the second value to a second processor.

34. The computer-readable storage device of claim 33, wherein the memory device is one of a double data rate (DDR) synchronous dynamic random access memory (SDRAM), a non-volatile random access memory (NVRAM), or a dynamic random access memory (DRAM).

35. An apparatus comprising:
  means for storing data; and
  means for modifying a value of a timing parameter at least partially based on in response to determining that a plurality of memory access requests received from a processor identify a first row of the means for storing data, wherein the timing parameter corresponds to a first number of timing cycles before data associated with at least one of the plurality of memory access requests is provided to a data bus.

36. The apparatus of claim 35, further comprising:
  means for transmitting the value of the timing parameter to the processor;
  means for receiving one or more memory access requests; and
  means for processing the one or more memory access requests.

37. The apparatus of claim 36, wherein the means for modifying the value of the timing parameter includes:
  means for determining a first value of the timing parameter based on a first memory access request, wherein the means for processing the one or more memory access requests processes the first memory access request based on the first value; and
  means for determining a second value of the timing parameter based at least in part on the first memory access request and a second memory access request, wherein the means for processing the one or more memory access requests processes the second memory access request based on the second value.

38. The apparatus of claim 37, wherein the first value corresponds to a sum of a row access latency and a column access latency and wherein the second value corresponds to the column access latency when a row address included in the second memory access request corresponds to a row address included in the first memory access request.

39. The apparatus of claim 37, wherein the first memory access request is received during a first timing cycle, wherein the second memory access request is received during a second timing cycle, and wherein the means for determining the second value comprises:
  means for determining a second number of elapsed timing cycles between the second timing cycle and the first timing cycle;
  means for determining a first difference between the second number of elapsed timing cycles and a threshold number of timing cycles;
  means for determining a second difference between the first value and the first difference; and
  means for determining the second value based on a comparison of the second difference to a threshold timing parameter value,
  wherein the second value corresponds to a greater of the second difference and the threshold timing parameter value, and
  wherein the threshold timing parameter value corresponds to a column access latency.

40. The apparatus of claim 39, wherein the threshold number of timing cycles corresponds to a column-to-column delay.

41. The apparatus of claim 39, wherein the threshold timing parameter value corresponds to a column access delay.

42. The apparatus of claim 35, wherein the means for storing data comprises one of a double data rate (DDR) synchronous dynamic random access memory (SDRAM), a non-volatile random access memory (NVRAM), or a dynamic random access memory (DRAM).

43. An apparatus comprising:
  means for processing data; and
  means for modifying a value of a timing parameter at least partially based on in response to determining that a plurality of transmitted memory access requests identify a first row of a plurality of storage elements, wherein the timing parameter corresponds to a first number of timing cycles before data associated with at least one of the plurality of transmitted memory access requests is received from a data bus.

44. The apparatus of claim 43, further comprising means for transmitting a first memory access request and a second memory access request to a memory device.

45. The apparatus of claim 44, wherein the first memory access request is transmitted during a first timing cycle, wherein the second memory access request is transmitted during a second timing cycle, wherein the means for modifying the value of the timing parameter comprises:
  means for determining a first value of the timing parameter based on the first memory access request;
  means for determining a second number of elapsed timing cycles between the second timing cycle and the first timing cycle;
  means for determining a first difference between the second number of elapsed timing cycles and a threshold number of timing cycles;
  means for determining a second difference between the first value and the first difference; and
  means for determining a second value of the timing parameter based on a comparison of the second difference to a threshold timing parameter value,
  wherein the second value corresponds to a greater of the second difference and the threshold timing parameter value, and
  wherein the threshold timing parameter value corresponds to a column access latency.

46. The apparatus of claim 43, integrated into at least one semiconductor die.

47. The apparatus of claim 46, further comprising a device selected from a group consisting of a set top box, a music player, a video player, an entertainment unit, a navigation device, a communications device, a personal digital assistant, a fixed location data unit, and a computer, into which the at least one semiconductor die is integrated.

48. A method comprising:
  a first step for receiving a first memory access request at a memory device from a processor, wherein the memory device includes a plurality of storage elements;
  a second step for processing the first memory access request based on a first value of a timing parameter of the memory device;

a third step for receiving a second memory access request at the memory device from the processor;

a fourth step for modifying the timing parameter of the memory device based on in response to determining that the first memory access request and the second memory access request identify a first row of the plurality of storage elements; and a fifth step for processing the second memory access request based on the modified timing parameter.

49. A method comprising:

receiving a data file comprising design information corresponding to a semiconductor device; and fabricating the semiconductor device according to the design information, wherein the semiconductor device comprises logic configured to modify a value of a timing parameter at least partially based on in response to determining that a plurality of memory access requests identify a first row of a plurality of storage elements, wherein the timing parameter corresponds to a number of timing cycles before data associated with at least one of the plurality of memory access requests is provided to a data bus.

50. The method of claim 49, wherein the data file includes a GDSII format.

51. The method of claim 49, wherein the data file has a GERBER format.

* * * * *